United States Patent
Heidmann

(10) Patent No.: US 8,659,291 B2
(45) Date of Patent: Feb. 25, 2014

(54) MAGNETO-OPTICAL DETECTION OF A FIELD PRODUCED BY A SUB-RESOLUTION MAGNETIC STRUCTURE

(75) Inventor: Juergen Heidmann, Salinas, CA (US)

(73) Assignee: Infinitum Solutions, Inc., Santa Clara, CA (US)

( * ) Notice: Subject to any disclaimer, the term of this patent is extended or adjusted under 35 U.S.C. 154(b) by 903 days.

(21) Appl. No.: 12/649,145

(22) Filed: Dec. 29, 2009

(65) Prior Publication Data

US 2010/0170017 A1    Jul. 1, 2010

Related U.S. Application Data

(60) Provisional application No. 61/142,007, filed on Dec. 31, 2008.

(51) Int. Cl.
G01R 33/032    (2006.01)
G11B 11/00    (2006.01)

(52) U.S. Cl.
USPC ............... 324/244.1; 369/13.01; 369/13.14

(58) Field of Classification Search
USPC ....................................... 324/244.1
See application file for complete search history.

(56) References Cited

U.S. PATENT DOCUMENTS

| | | | |
|---|---|---|---|
| 4,896,103 A | 1/1990 | Shimanuki et al. | |
| 5,212,446 A | 5/1993 | Itoh et al. | |
| 5,631,559 A | 5/1997 | Oliver et al. | |
| 5,663,652 A | 9/1997 | Freeman | |
| 5,835,257 A | 11/1998 | Itoh et al. | |
| 5,969,517 A | 10/1999 | Rao | |
| 6,084,396 A | 7/2000 | Rao | |
| 6,141,093 A | 10/2000 | Argyle et al. | |
| 6,934,068 B2 | 8/2005 | Kochergin | |
| 7,271,900 B2 | 9/2007 | Decitre et al. | |
| 8,289,818 B2 | 10/2012 | Taratorin et al. | |
| 2002/0027835 A1 | 3/2002 | Takagi et al. | |
| 2005/0002318 A1 | 1/2005 | Murakami et al. | |
| 2005/0163026 A1 | 7/2005 | Oshima et al. | |
| 2006/0022668 A1 | 2/2006 | Yamamoto | |
| 2007/0058494 A1 | 3/2007 | Murakami et al. | |

*Primary Examiner* — Bot Ledynh
(74) *Attorney, Agent, or Firm* — Silicon Valley Patent Group LLP

(57) ABSTRACT

A polarization microscope optically detects the effect of the magnetic field from a sub-optical resolution magnetic structure on a magneto-optical transducer. The magneto-optical transducer includes a magnetic layer with a magnetization that is changed by the magnetic field produced by the magnetic structure. The saturation field of the magnetic layer is sufficiently lower than the magnetic field produced by the magnetic structure that the area of magnetization change in the magnetic layer is optically resolvable by the polarization microscope. A probe may be used to provide a current to the sample to produce the magnetic field. By analyzing the optically detected magnetization, one or more characteristics of the sample may be determined. A magnetic recording storage layer may be deposited over the magnetic layer, where a magnetic field produced by the sample is written to the magnetic recording storage layer to effect the magnetization of the magnetic layer.

60 Claims, 15 Drawing Sheets

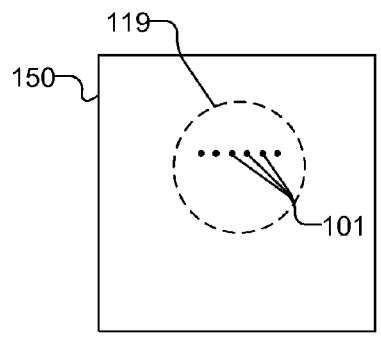
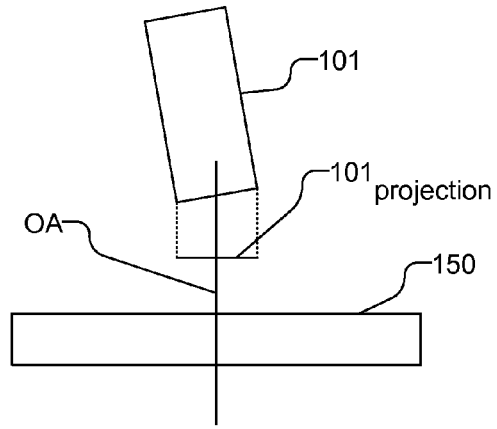
Fig. 3A                 Fig. 3B
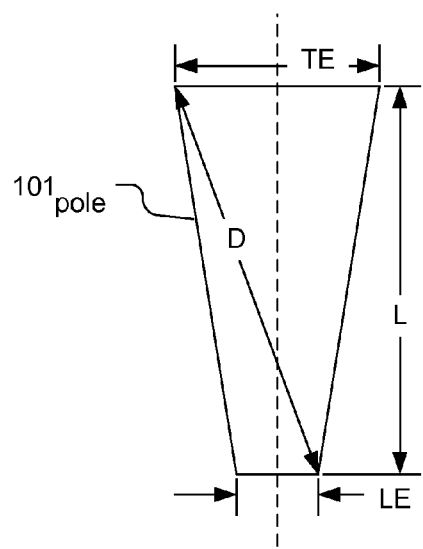
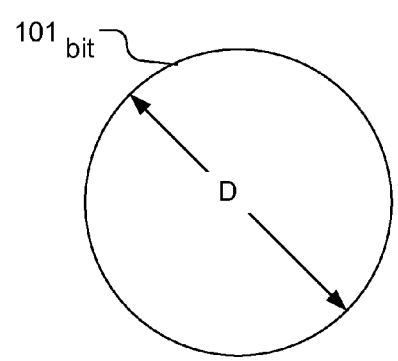
Fig. 3C                 Fig. 3D

MAGNETO-OPTICAL DETECTION OF A FIELD PRODUCED BY A SUB-RESOLUTION MAGNETIC STRUCTURE

CROSS REFERENCE TO RELATED APPLICATIONS

This application claims the benefit of Provisional Application No. 61/142,007, filed Dec. 31, 2008, which is incorporated by reference herein in its entirety.

BACKGROUND

As technology advances, devices continue to shrink in size and it becomes increasingly difficult to test or verify the operation of the devices. One example of this is found in storage systems based on magnetic recording technology, which is commonly used in devices such as computers and digital electrical household appliances. In operation, a magnetic write head is used to magnetize bits of data on a recording medium, commonly referred to as a hard disk, while a read sensor is used to read the bits of data from the hard disk.

It is desirable to test devices, such as read sensors and write heads, early in the manufacturing process to increase yield and reduce costs. However, as devices, such as the read sensors and write heads, continue to shrink in size it is increasingly difficult to perform accurate measurements early in the manufacturing process. For example, a write head uses a write pole that has a size that is below the resolution of conventional optical imaging techniques. Accordingly, to image the write pole, typically a scanning electron microscope (SEM) is used. However, SEM is an expensive, time consuming test that is potentially destructive. Another method of testing a writer is with Magnetic Force Microscopy (MFM), where an MFM probe scans across the surface of the write pole while the writer is excited with a current. Alternatively, a spin-stand is sometimes used to test the write head. However, a spin-stand test is also an expensive and time-consuming test.

SUMMARY

In one embodiment, a polarization microscope including an optical detector is used to optically detect the effect of a magnetic field from a sub-resolution magnetic structure in a sample on a magneto-optical transducer that includes a magnetic layer. The magneto-optical transducer includes a magnetic layer with a magnetization that is changed by the magnetic field produced by the magnetic structure. The saturation field of the magnetic layer is sufficiently lower than the magnetic field produced by the magnetic structure that the area of change in magnetization in the magnetic layer is larger than the optical resolution limit of the polarization microscope. The sample is held so that a reflective layer is between the magnetic layer and the sample and so that the magnetic layer is between the sample and the optical detector. A probe is used to supply a current to the sample to cause the sample to produce a magnetic field during imaging.

In another embodiment, a polarization microscope including an optical detector is used to optically detect the effect of a magnetic field from a write head on a magneto-optical transducer. The magneto-optical transducer includes a magnetic layer with a magnetization that is changed by the magnetic field produced by the write head. The saturation field of the magnetic layer is sufficiently lower than the magnetic field produced by the write head that the area of change in magnetization in the magnetic layer is larger than the optical resolution limit of the polarization microscope. A loader is configured to hold the write head so that a reflective film is between the magnetic layer and the write head. A probe is included that is configured to be coupled to the write head and provide a write current to the write head to cause the write pole in the write head to produce the magnetic field that causes a change in magnetization in the magnetic layer.

In another embodiment, a magnetic field producing sample is placed on a magneto-optical transducer. The sample produces a magnetic field from a magnetic field producing structure that alters the orientation of the magnetization of the magneto-optical transducer while the magnetization of the magnetic layer is optically detected by a polarization microscope, wherein the magnetic field producing structure in the sample is smaller than the optical resolution of the polarization microscope. The magnetic layer of the magneto-optical transducer is selected to have a saturation field that is lower than the magnetic field of the sample so that the magnetic field causes a change in the magnetization in the magnetic layer over an area that is larger than the optical resolution limit of the polarization microscope. The optically detected magnetization of the magnetic layer is then analyzed to determine a characteristic of the magnetic field producing sample and the determined characteristic is stored in memory.

BRIEF DESCRIPTION OF THE DRAWINGS

FIG. 3A illustrates a plan view of the magneto-optical transducer and illustrates the field of view of the objective lens.

FIG. 3B illustrates a projection of the magnetic field producing structure of the sample with respect to the optical axis.

FIG. 3C illustrates a projection of the magnetic field producing structure when the magnetic field producing structure is a write pole.

FIG. 3D illustrates a projection of magnetic field producing structure when the magnetic field producing structure is a bit imprinted by a HAMR write head with the heating element enabled on a magnetic recording layer that overlies the magnetic layer of the magneto-optic transducer.

DETAILED DESCRIPTION

Figures 1A, 1B:
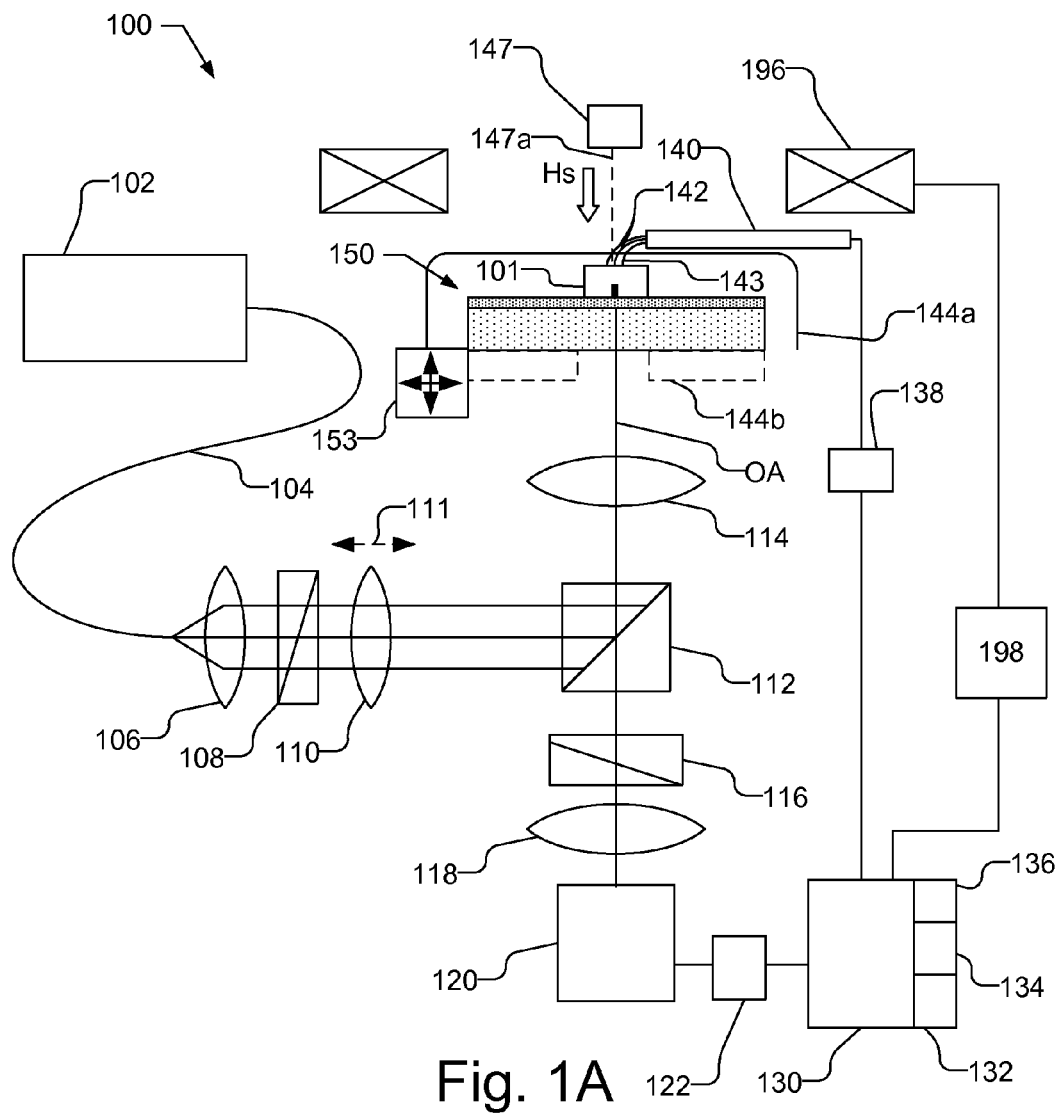
FIG. 1A illustrates a polarization microscope that uses a magneto-optical transducer to optically detect the effects of a magnetic field produced by a magnetic field producing structure that is below the optical resolution of the optics of the device.
FIG. 1B illustrates a cross-sectional view of a magneto-optical transducer.

FIG. 1A illustrates an optical imaging device 100 that uses a magneto-optical transducer 150 to optically detect the effects of a magnetic field produced by a magnetic field producing structure that is smaller than the optical resolution of the optics of the device 100. By way of example, device 100 may be used to optically detect the magnetic field produced by a write head or other similar small magnetic structures. A magneto-optical transducer 150 converts a magnetic field into an optical contrast utilizing the Faraday or Kerr effect. The device 100 may be a polarization microscope, such as a magneto-optic microscope system that uses the Faraday or Kerr effect, and may be, e.g., a white field microscope or a confocal microscope.

The device includes a light source 102, which may be a broadband light source, a light emitting diode (LED), or a laser, e.g., a 40 mW laser with a wavelength of 630 nm. If desired, the wavelength of light used may be in the non-visible region of the spectrum, e.g., UV or DUV. The light from the light source 102 is provided to a collimator 106 either directly or by way of an intervening optical element, e.g., fiber optics 104 or a light pipe. The collimator 106 expands and collimates the light, which is polarized by polarizer 108 and focused by lens 110. In an embodiment in which the device is a confocal polarization microscope, the lens 110 (and/or other appropriate lens(es)) may be moved back and forth, as illustrated by arrow 111. Additionally, appropriate apertures may be used in an embodiment in which the polarization microscope is a confocal microscope. A beam splitter 112 reflects a portion of the light and the light is focused by an objective lens 114, e.g., at a normal angle of incidence. It should be understood, however, that an oblique angle of incidence may be used with an appropriate adjustment of the optics in device 100. The objective lens 114 focuses the light onto a magneto-optical transducer 150, which is illustrated in cross-sectional view in FIG. 1B. The magneto-optical transducer 150 includes a magnetic layer 152 such as a ferrimagnetic garnet film on a substrate 156 and may include a reflective layer 154 may be located between the sample 101 and the magnetic layer 152. The magneto-optical transducer 150 may further include a protective layer 158. If desired, the reflective layer 154 may be deposited on the magnetic layer 152 and is therefore part of the magneto-optical transducer 150 as illustrated in FIG. 1A, or alternatively, may be separate from the magnetic layer 152, e.g., applied to the bottom of the sample 101 or to a handling system and placed on the magnetic layer 152 when the sample 101 is loaded onto the device 100.

The light reflected from the magneto-optical transducer 150 passes back through the objective lens 114 and is transmitted through the beam splitter 112. A polarizer 116 analyzes the polarization state of the return light, which is focused by lens 118 onto an optical detector 120. By way of example, the polarizer 108 and the polarizer 116 are set to have an angle difference of ±16°. In one embodiment, a polarizing beam splitter 112 may be used in place of the polarizer 108 and polarizer 116.

When a laser is used as the light source 102, the coherence of the laser light has to be reduced or eliminated to avoid speckles and diffraction artifacts in the image. The coherence of the laser light can be reduced by one or more of the following; vibrating the optical fiber 104, modulating the laser at a frequency of e.g. 250 MHz or by inserting an optical diffuser in the illuminating light path. In a different approach, a multimode laser diode can be used to reduce light coherence with or without the previous measures implemented.

The optical detector 120 may be, e.g., a CCD or a CMOS based camera, or other appropriate imaging device. For example, a high resolution CCD camera with 1334×1024 pixels and 12 bit, such as that produced by Hamamatsu Co may be used as the optical detector 120. In another embodiment, e.g., the optical detector 120 may be a non-imaging photodetector, such as a photodiode, which detects the optical intensity at a single spot. If desired, when a photodiode, or other non-imaging photodetector, is used as the optical detector 120, the device 100 may produce a two-dimensional image by scanning the illuminated area with respect to the sample 101, e.g., by providing relative movement between the optical system (i.e., the lenses 106, 110, 114, and 118; polarizer 108 and polarizer 116; beam splitter 112; and optical detector 120) and the sample 101, e.g., using actuator 153, or through appropriate optical manipulation of the incident beam, e.g., using scanning mirrors. Further, to improve signal to noise ratio (SNR) when using a non-imaging photo detector, a lock-in amplifier may be used to measure the out-put signal of the photo detector and by modulating the write current or alternatively by modulating the illuminating light of the polarization microscope. The use of a lock-in amplifier is also beneficial if the detector field-of-view is large, meaning the portion of the image that is changing is small compared to the overall image area to improve sensitivity and increase SNR. Moreover, a lock-in amplifier may be used for media-type testing, i.e., using a particular recording medium that is deposited over the magnetic layer 152 of the magneto-optic transducer 150 using, e.g., one or more heads, by modulating the write current or alternatively by modulating the illuminating light of the polarization microscope. In the case of an HAMR type recording head, instead of modulating the write current the heating source, e.g. a laser, can be modulated.

The optical detector 120 is connected to a processor 130 via an optional frame grabber 122 and the processor 130 receives, stores, and analyzes the optically detected data provided by the optical detector 120. The processor 130 includes a computer-usable medium 132 having computer-readable program code embodied therein for causing the processor 130 to control the device and to perform a desired analysis, as described herein. If desired, multiple separate processing units may be used to perform discrete tasks, which may be coupled together or may be separated. The data structures and software code for automatically implementing one or more acts described in this detailed description can be implemented by one of ordinary skill in the art in light of the present disclosure and stored on a computer readable storage medium, which may be any device or medium that can store code and/or data for use by a computer system such as processor 130. This includes, but is not limited to, magnetic and optical storage devices such as disk drives, magnetic tape, compact discs, and DVDs (digital versatile discs or digital video discs). The processor 130 includes storage/memory 134 and a display 136 for storing and/or displaying the results of the analysis of the data. The display 136 may be, e.g., a printer or monitor.

The device 100 is configured to measure desired characteristics of a sample 101 when the sample 101 or the magnetic field producing structure of the sample 101 are below the optical resolution of the optics in the device 100. For example, the sample 101 may be a hard disk drive (HDD) write head in the form of a bar, slider, HGA (head gimbal assembly), and HSA (head stack assembly), a Heat Assisted Magnetic Recording (HAMR) write head, or a tape write head or other localized field electromagnet, and the magnetic field producing structure is a write pole in the write head. For a write head sample 101 or other electromagnetic sample 101, the device 100 includes a probe card 140 that is configured to be coupled to the sample 101 to provide a current, which will induce the sample 101 to produce the magnetic field. The probe card 140 may be connected to the sample 101 using one or more probes 142, which may be, e.g., pogopins, probes, or other contacts such as wires that are wire bonded. The probe card 140 is coupled to current or voltage source 138, which is connected to and controlled by processor 130.

When the sample 101 is a write head that includes a Dynamic-Flying Height (DFH) device, one of the probes 142 of the probe card 140 may be used to provide current to the DFH device on a write head sample 101. The source of the current may be a second circuit in the current or voltage source 138. Write heads use a DFH device as an adjustment mechanism to internally bias the write pole closer to or further from air bearing surface. The DFH device is typically in the form of a heater incorporated into the write head structure, with additional contact pads for external connection. By applying a bias to the additional contact pads via the probe card 140, the position of the write pole can be adjusted towards or away from the air bearing surface of the write head. By adjusting the position of the write pole via the DFH device, the sample 101 may be measured at different temperatures and/or vertical displacement from the magneto-optical transducer 150.

Additionally, when the sample 101 is a write head that includes a microactuator device, one of the probes 142 of the probe card 140 may be used to provide current to the microactuator device on a write head sample 101. The source of the current may be a second circuit in the current or voltage source 138. Write heads use a microactuator device as an adjustment mechanism to move the write pole in the cross-track direction to better align the write pole to the lands of a disk that is being written to. The microactuator device is incorporated into the write head structure, which includes additional contact pads for external connection. By applying a bias to the additional contact pads via the probe card 140, the position of the write pole can be adjusted in the cross-track direction. By adjusting the position of the write pole via the microactuator device during measurement with the device, the performance of the microactuator may be verified and the characteristics of the sample 101 may be measured at different write pole positions.

Additionally, when the sample 101 is a HAMR write head that includes a thermal device, such as a high intensity light source, a connector element 143 may be used to connect to and operate the thermal source of the HAMR write head sample 101. It should be understood that the connector element 143 may be a probe in the probe card 140. Alternatively, if the thermal source is external to the HAMR write head sample 101, e.g., laser 147, then the light from laser 147 is provided to the HAMR write head sample 101 as illustrated by light path 147*a*.

The device 100 may also include a temperature control element that is thermally coupled to the sample and used to heat and/or cool the sample 101 during measurement and is coupled to and controlled by the processor 130. The temperature control element may be, e.g., a temperature control chamber 144*a* into which the sample 101 is positioned. The temperature control element may be a temperature plate 144*b* that is in contact with the sample 101, e.g., through the magneto-optical transducer 150. The temperature plate 144*b* may include an aperture through which the objective lens 114 is permitted to focus on the magneto-optical transducer 150, as illustrated in FIG. 1A.

The device 100 may also include an external magnetic field source 196 as shown in FIG. 1A. The magnetic field source 196 is controlled by a field controller 198, which may be coupled to and controlled by the processor 130. The controller 198 may be, e.g., a current or voltage source and may control the field source 196 to turn the magnetic field on or off or to vary the magnitude and polarity of the magnetic field or to provide a pulsed write current, as used by a typical write driver in HDD applications. The external magnetic field source 196 may be used to produce a magnetic field in the shield of a write head sample. The field produced by the shield can then be viewed using the magneto-optical transducer 150 to confirm the location of the write head sample 101 within the field of view of the optics of the device 100. Confirming the location of the sample is advantageous as it confirms that the sample is in the field of view or can be used to reposition the sample such that it will be within the viewing area. Moreover, by knowing the location of the sample within the field of view, the image area that is processed can be reduced thereby speeding up the testing. Additionally, the field produced by the shield may be imaged with the magneto-optical transducer 150 and used to aid in loading the sample 101 so that there is good optical contact between the sample 101 and the magneto-optical transducer 150. Further, the field produced by the shield may be imaged with the magneto-optical transducer 150 and used to aid in focusing the device 100.

The focus of the device 100 may be automatically or manually adjusted using actuator 153 to maximize the contrast produced by the magnetic field from the shield of the write head in the magneto-optical transducer 150. If desired, actuator 153 may be used only for focusing/height adjustment and not lateral movement of the magneto-optical transducer 150. Alternatively, the optics may be moved with respect to the magneto-optical transducer 150. In one embodiment, a coarse focus is performed using the field produced by the shield from the external magnetic field source 196, followed by fine focus using the magnetic field produced by the write pole from the sample 101 to find the focal position that produces the maximum magneto-optical peak contrast. In one embodiment, focusing of the device may be performed by projecting a diaphragm or small structure on the magneto-optical transducer 150 and automatically or manually adjusting the focus to produce the sharpest image of the diaphragm or small structure. It should be understood that when using actuator 153 to move the magneto-optical transducer 150, the sample 101 and probecard 140/142 may be moved as well so that the sample 101 remains stationary with respect to the magneto-optical transducer 150 as it is being moved towards or away (or laterally) with respect to the optics, particularly during a fine focus adjustment using the magnetic field produced by the write pole. Alternatively, the probecard 140/142 may have enough compliance that it need not be moved during the fine focusing procedure or the probecard 140/142 may be removed and recoupled to the sample 101 before and after the fine focusing procedure.

The external magnetic field source 196 may be used to apply an external biasing field to partially or completely saturate the magneto-optical transducer or the sample 101. Field biasing may be used to increase the contrast when the sample produces a field in the opposite polarity of the external field, which produces a biased background in the magneto-optical transducer 150. Additionally, non-pole portions of the sample head that produce stray fields may be saturated with the external field, reducing the effects on the magneto-optical transducer 150 from non-pole structures so that the magneto-optic contrast of the pole structure is further enhanced. Additionally, the external magnetic field source 196 may be used to produce an AC or DC field to erase a magnetic layer that may be applied on the garnet, as described below. For example, the sample 101 may write a bit to a magnetic layer on the magneto-optical transducer 150, which can then be imaged. After testing and in preparation for the next sample to be tested, the written bit is erased using the external magnetic field source 196. If external magnetic field source 196 AC erases the magnetic layer on the magneto-optical transducer 150, then a bit written to the magnetic layer will have only half the contrast vs. the average background. However, if the external magnetic field source 196 applies a DC bias, as discussed above, then a bit written with a polarity in opposite direction to the DC bias will have a maximum contrast. It should be understood that the external magnetic field source 196 may be composed of several magnets. For example, the field required to magnetize the shields may only be 100 Oe, but to erase the magnet layer a field of 6K Oe may be needed. The external magnetic field source 196 may be a controllable magnetic field source by using electromagnets or permanent magnets that may or may not be mounted to a separate stage assembly to accommodate the desired range in fields or a combination thereof.

Figure 2A:
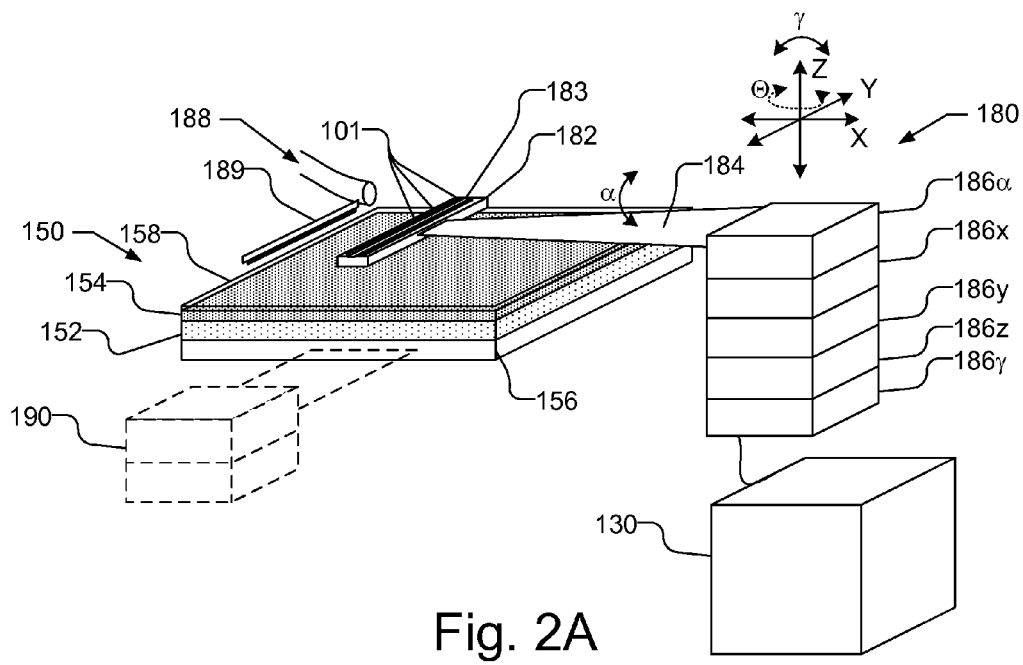
FIGS. 2A and 2B illustrate a perspective view of the magneto-optical transducer and a loader holding samples in bar form and slider form, respectively, and that may be part of the device of FIG. 1A.

FIG. 2A illustrates a perspective view of a magneto-optical transducer 150 and a loader 180 that may be part of the device 100. The magneto-optical transducer 150 includes a magnetic layer 152, such as a ferrimagnetic garnet film with in-plane anisotropy. A suitable garnet film for the magnetic layer 152 may be polycrystalline or monocrystalline and deposited over a non-magnetic garnet substrate 156 that is optically transparent at the wavelength or wavelengths used by the light source 102. By way of example, the substrate 156 may be a Gallium-Gadolinium-garnet that is, e.g., 0.5 mm to 1 mm thick. If desired, an anti-reflection layer (not shown), which may be optimized for the wavelength of the illuminating light (e.g., 630 nm) may be deposited on the bottom of the garnet substrate 156, i.e., facing the light source. The garnet film 152 may be deposited on the substrate 156, e.g., by liquid phase epitaxi, and may be formed with various compositions and thickness ranges. By way of example, one suitable film is a monocrystalline garnet film 152 having a composition of $(Bi,Y,Pr)_{3.0}(Fe,Ga)_{5.0}O_{12.0}$, and a thickness range of between 0.3 μm and 5 μm, and in one embodiment is 3 μm thick and has a saturation field of approximately 740 Oe. However, other compositions and thickness ranges and saturations fields may be used. For the sake of simplicity, the magnetic layer 152 may sometimes be referred to as a garnet film 152, but it should be understood that the magnetic layer 152 is not limited to garnet. For example, the magnetic layer 152 may be formed from magnetic films such as NiFe, Ni, NiCr, CoFe, NiFeCr, or CoNiFe alloys or single crystals made from these elements if desired. It should be understood that magnetic films of Ni, NiCr, NiFe, CoFe, NiFeCr or CoNiFe are reflective and thus, the Kerr effect is employed by the device.

Where a garnet film 152 is used and is transparent to the light from the light source 102, a reflective layer 154 is used to reflect light back through the garnet film towards the optical detector 120. The reflective layer 154 is effectively part of the magneto-optical transducer 150 as it reflects the light back through the magnetic layer 152, but the reflective layer 154 need not overlie the magnetic film 152. Thus, while in one embodiment, as illustrated in FIGS. 1B and 2A, the reflective layer 154 is illustrated as being deposited on and overlying the magnetic layer 152, if desired, the reflective layer may be separable from the magnetic layer 152, e.g., the reflective layer 154 may be applied to the bottom of the sample 101 or onto to a handling system and placed on the magnetic layer 152 when the sample 101 is loaded onto the device 100. The reflective layer 154 may be formed from a layer of, e.g., gold, silver, or aluminum and may be, e.g., 20 nm to 50 nm. In one embodiment, a protective layer 158 may be deposited over the reflective layer 154, i.e., between the reflective layer 154 and the sample 101. The protective layer 158 may be formed from $SiO_2$, $TiO_2$, $Al_2O_3$, or $CrO_2$, or diamond-like carbon (DLC) and may be 1 nm-40 nm thick. It should be understood that magnetic films of Ni, NiCr, NiFe, CoFe, NiFeCr or CoNiFe are reflective and thus, the reflective layer 154 may not be necessary if the magnetic layer is thick enough to adequately reflect the light from the light source 102.

Figure 2B:
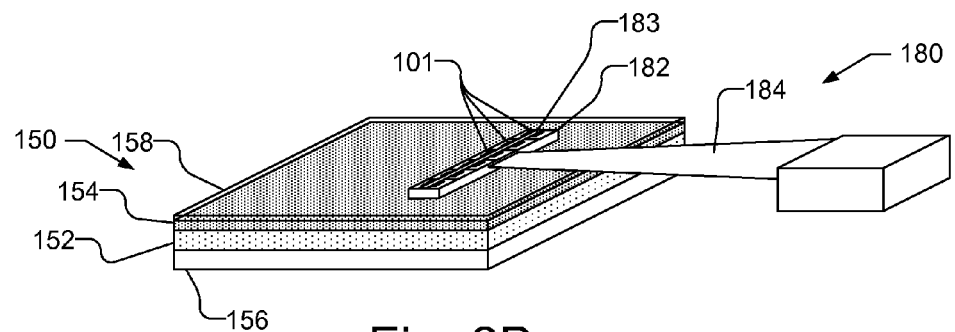

FIG. 2A also illustrates one embodiment of a loader 180 that holds one or more samples 101 and positions the samples 101 with respect to the magneto-optical transducer 150. FIG. 2A illustrates the samples 101 in bar form. FIG. 2B is similar to FIG. 2A, but shows the samples in individual form. As illustrated in FIG. 2A, the loader 180 may include a mount 182 for holding the samples 101 and an arm 184. The arm 184 may be compliant to hold the sample 101 against the magneto-optical transducer 150 with an appropriate force, as well as to hold the sample 101 in place if the magneto-optical transducer 150 is moved in the Z axis during focusing without moving the loader 180. The loader 180 may also include one or more actuators, such as actuators 186x, 186y, and 186z that move the samples 101 in the X, Y, and Z directions. The loader 180 may include additional actuators 186α and 186γ that may be used to respectively tilt or pitch the samples 101 with respect to the magneto-optical transducer 150. If desired, the loader 180 may also or alternatively move the samples 101 in θ direction. The loader 180 is connected to and controlled by processor 130. The loader 180 positions the one or more samples 101 on or close enough to the magneto-optical transducer 150 that the magnetization of the magnetic layer 152 is effected by the magnetic field produced by the samples 101. Further, the loader 180 is configured to hold the samples 101 flat with respect to the magnetic layer 152 in the magneto-optical transducer, e.g., by holding the samples 101 flat against the reflective layer 154 or the protective coating 158 over the reflective layer 154 if used. By way of example, as illustrated in FIG. 2A, a clamp 183 may be used to hold a plurality of samples 101 in slider form in the mount 182, which holds the samples 101 against the magneto-optical transducer 150. In one embodiment, inclination of the samples 101 may be tilted and pitched, as illustrated by arrow α and arrow γ, so that the magnetic field producing structure on the sample 101, e.g., a write pole, is held close to and/or flat against the magneto-optical transducer 150. The amount of tilt α and pitch γ used with a sample 101 may be determined during the focusing procedure, e.g., with the magnetic field produced by the external magnetic source 196 generating a field in the shield of a write head sample. The tilt α and pitch γ may be adjusted to maximize the contrast produced by the magnetic field from the shield of the write head in the magneto-optical transducer 150 as well as for magneto-optic contrast maximization discussed above.

Figure 2C:
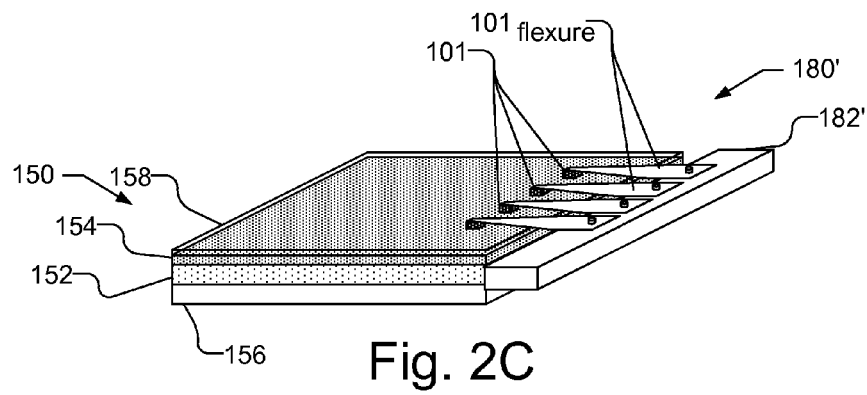
FIG. 2C illustrates another embodiment of a loader that holds one or more samples in head gimbal assembly form.

It should be understood that the samples 101 may come in forms other than bar and individual sliders, as illustrated in FIGS. 2A and 2B, such as in head gimbal assembly or head stack assembly form. FIG. 2C illustrates an embodiment of a loader 180' that holds one or more samples 101 in head gimbal assembly form. As illustrated in FIG. 2C, samples 101 are attached to flexures $101_{flexure}$, which are held by a mount 182'. The positioning of the mount 182' and the flexures $101_{flexure}$ bias the samples 101 to be held flat against the magneto-optical transducer 150. Samples 101 in a head gimbal stack form may be held in a similar manner, where the flexures bias the sample 101 to be held flat against the magneto-optical transducer 150. The loader 180' may have all the position and spring compliance capabilities of loader 180 and be controlled by processor 130 as described above.

Figure 2D:
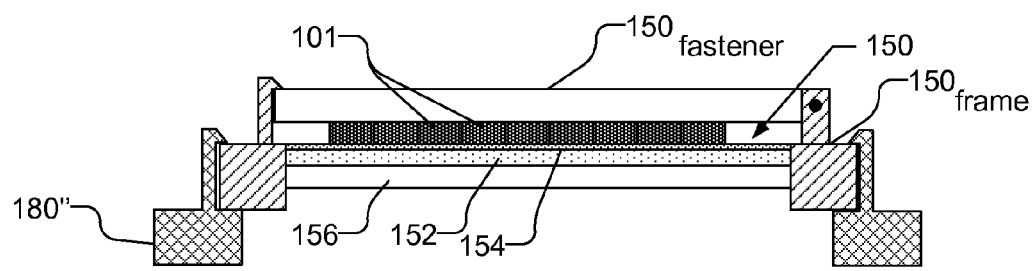
FIG. 2D illustrates a cross-sectional view of an embodiment of a loader that holds the magneto-optical transducer with samples in bar form held to the magneto-optical transducer with a mechanical fastener.

FIG. 2D illustrates a cross-sectional view of an embodiment of a loader 180" that holds the magneto-optical transducer 150 with samples 101 when the samples 101 are in bar form. It should be understood, however, that loader 180" could be used with samples 101 in slider, HGA or other form. The magneto-optical transducer 150 includes a frame $150_{frame}$ that supports the substrate 156 along with the magnetic layer 152 and the reflective layer 154 if it is part of the magneto-optical transducer 150. A fastener is used to hold samples 101 in bar form flat against the magneto-optical transducer 150. For example, in FIG. 2D, a clamp $150_{fastener}$ that is attached to the frame $150_{frame}$ is used to hold the samples 101 in bar form. A loader 180" is used to hold the magneto-optical transducer 150 within the field of view of the objective lens 114 (FIG. 1) while the samples 101 are held on the magneto-optical transducer 150. The loader 180" may be, e.g., a clamp or other mechanical fastening device to hold the magneto-optical transducer 150. In use, the samples 101 in bar form may be mounted to the magneto-optical transducer 150, e.g., by fastener $150_{fastener}$, before the magneto-optical transducer 150 is mounted to the loader 180". After measurement of the samples 101, the magneto-optical transducer 150 with the attached samples 101 is removed from loader 180" and a different or the same magneto-optical transducer 150 with new samples 101 attached may again be mounted to the device 100. In one embodiment, many magneto-optical transducers 150 may be used and the samples 101 pre-mounted to the magneto-optical transducers 150 so as to increase throughput. In another embodiment, the clamp $150_{fastener}$ may be part of the loader 180", in which case the samples 101 cannot be pre-loaded on to the magneto-optical transducer 150. The loader 180" may be positioned using actuators 186 as described above. The loader 180" may include variation in the pitch and tilt as part, e.g., of the fastener $150_{fastener}$.

Figure 2E:
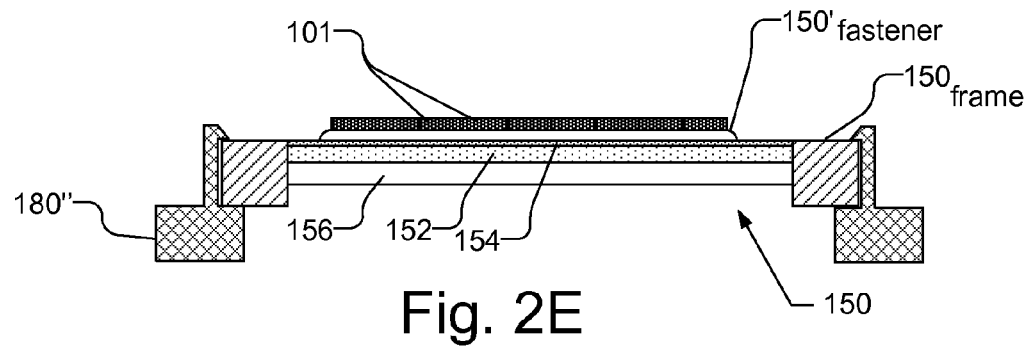
FIG. 2E is similar to FIG. 2D, but illustrates the samples in bar form held to the magneto-optical transducer with an adhesive fastener.

FIG. 2E illustrates a cross-sectional view a loader 180" similar to that shown in FIG. 2D, but where a mechanical faster is not used to hold the samples 101 to the magneto-optical transducer 150. As illustrated in FIG. 2E, the fastener $150'_{fastener}$ is an adhesive fastener that adheres the samples 101 in bar form to the magneto-optical transducer 150. The fastener $150'_{fastener}$ may be a soluble adhesive or thermoplastic that can be removed to separate the samples 101 from the magneto-optical transducer 150 and permitting use of the magneto-optical transducer 150 to be used with subsequent samples 101.

Over time and with multiple contacts with samples under test, the magneto-optical transducer 150 may become contaminated at the location of contact with the samples. Accordingly, as illustrated in FIG. 2A, the device 100 may include a cleaner 188 that is used to clean the magneto-optical transducer 150 to assure proper contact between the samples 101 and the magneto-optical transducer 150. For example, the cleaner 188 may include air, gas or liquid wash supply that applies the air gas or liquid wash to the top surface of the magneto-optical transducer 150. The cleaner 188 may also include a wiper 189 to physically wipe the surface of the magneto-optical transducer 150.

Additionally, in one embodiment, one or more actuators may be used to provide a relative change in position of the magneto-optical transducer 150 with respect to the magneto-optical imaging area and the location of where the samples 101 are loaded. By way of example, actuators 190 may be coupled to the magneto-optical transducer 150 and may move the magneto-optical transducer 150 after a set number of contacts with samples 101, e.g., after a 1000 contacts, to load the samples 101 at an uncontaminated portion of the magneto-optical transducer 150. Alternatively, the magneto-optical transducer 150 may move after every measurement and, if desired, periodically return to load locations a number of times. If the magneto-optical field of view is large enough, the actuators 186x and 186y may be used to move the samples 101 to uncontaminated areas of the magneto-optical transducer 150 without requiring the use of actuators 190.

Further, the magneto-optical transducer 150 may be a replaceable component that is removably attached to the device 100, e.g., as illustrated in FIGS. 2D and 2E. After a number of uses or after the condition of the magneto-optical transducer 150 is degraded, the magneto-optical transducer 150 may be replaced with a different magneto-optical transducer 150.

FIG. 3A illustrates a plan view of the magneto-optical transducer 150 and illustrates the field of view 119 of the objective lens 118. The objective lens 118 may be 50+ to 100+ magnification with an NA of approximately 0.75 and produce a field of view of approximately 125 μm-250 μm. A plurality of samples 101 are illustrated by solid dots. As can be seen, a number of samples 101 may fit within the field of view 119, but it should be understood that the magneto-optical transducer 150 is positioned between the samples 101 and the objective lens 118, and thus, while the samples 101 are within the area of the field of view 119, the samples 101 are hidden from the objective lens 118 by the magneto-optical transducer 150. With a large field of view 119, a plurality of samples 101 may be optically detected via the magneto-optical transducer 150 simultaneously without requiring a relative movement between samples 101 and the objective lens 118 of the device 100. Additionally, a large field of view 119 with respect to the size of the samples 101 reduces the positioning constraints of the loader 180 (and loaders 180' and 180").

The device 100 is configured to measure desired characteristics of a sample 101 when the projection of the magnetic field producing structure of the sample 101 is dimensioned below, i.e., is smaller than, the optical resolution limit of the optics in the device 100, i.e., the optics of the device 100 could not image the sample 101. Theoretically, the optical resolution limit of the optics of the device 100 is defined by the Rayleigh Criterion as:

$$d = \frac{1.22\lambda}{2n\sin\alpha}$$ Equation 1 where λ is the wavelength of the incident light, n is the numerical aperture of the objective lens and α is the angle of incidence. By way of example, at normal incidence with a wavelength of 640 nm and an objective numerical aperture of 0.75, the optical resolution is 520 nm. In practice, however, the actual optical resolution limit, i.e., the smallest dimension that is optically resolvable by the device, is typically much worse than suggested by the theoretical limit by 20% or more due to factors such as spherical aberration of the objective lens and the illumination aperture.

FIG. 3B illustrates a projection of the magnetic field producing structure of the sample 101 with respect to the optical axis OA. The projection $101_{projection}$ is the projection of the sample 101 on a plane perpendicular to the optical axis OA of the device 100. The sample 101 in this case may be a write pole that has a tip of approximately 100 nm. Generally, the sample 101 will be held parallel to the magneto-optical transducer 150, and thus, approximately perpendicular to the optical axis OA, and thus, the projection $101_{projection}$ is approximately 100 nm. Typically, to resolve the tip of a write pole to form an image, a scanning electron microscope must be used as conventional imaging techniques are inadequate. The device 100 is configured to optically detect the effects of the magnetic field produced by a sub-resolution projection of a magnetic field producing structure by controlling the distance of the sample 101 from the magnetic layer 152 of the magneto-optical transducer 150 and by using a magnetic layer 152 in the magneto-optical transducer 150 with a saturation field that is configured so that the magnetic field produced by the sample 101 results in a response in the transducer that is resolvable by the optics of the device 100.

FIG. 3C illustrates a projection of the magnetic field producing structure when the magnetic field producing structure is a write pole $101_{pole}$. As illustrated in FIG. 3C, the projection of the write pole $101_{pole}$ has the same dimension (e.g., when the write pole $101_{pole}$ is normal to the plane that is perpendicular to the optical axis OA of the device 100) or smaller dimension (e.g., when the write pole $101_{pole}$ is at an angle with respect to the plane that is perpendicular to the optical axis OA of the device 100) and the same shape as the tip of the write pole $101_{pole}$ which may have a trapezoidal shape, with a Trailing Edge (TE) that is e.g., 100 nm wide in the cross-track direction, a length L that is 250 nm in the down-track direction, and a Leading Edge (LE) that may be as short as 0 nm, i.e., the write pole $101_{pole}$ tip is triangularly shaped, but typically may be approximately half of the trailing edge (TE), e.g., 50 nm. In the case of a 50 nm LE, as illustrated in FIG. 3C, the diagonal line (D) will be about 261 nm, making this the longest linear dimension of this sample. The shape that is imprinted on magnetic layer 152 or in a magnetic recording layer 162, described below in reference to FIGS. 4C and 4D, will be similar to the shape of the tip of the write pole $101_{pole}$.

Figure 4A:
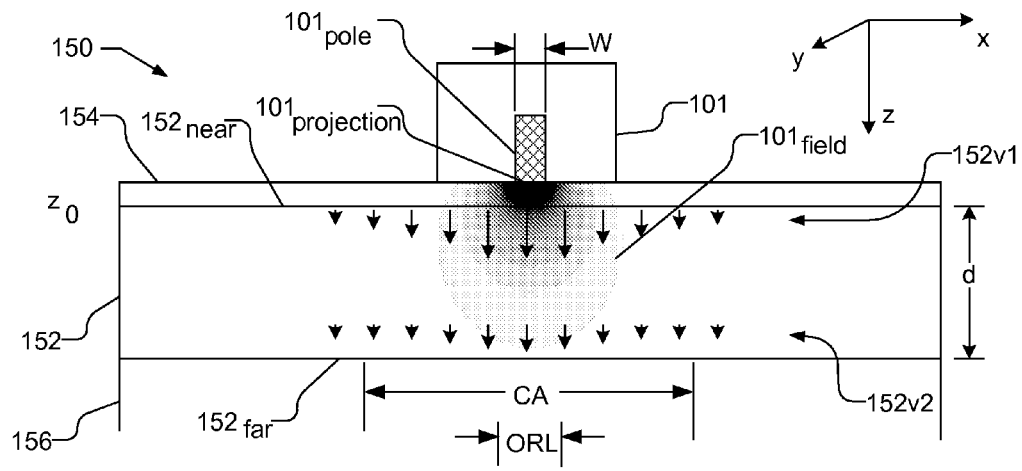
FIG. 4A illustrates a cross-sectional view of a magneto-optical transducer, including a ferrimagnetic garnet film and a reflective layer, along with a sample in the form of a write head, including a write pole.
Figure 4B:
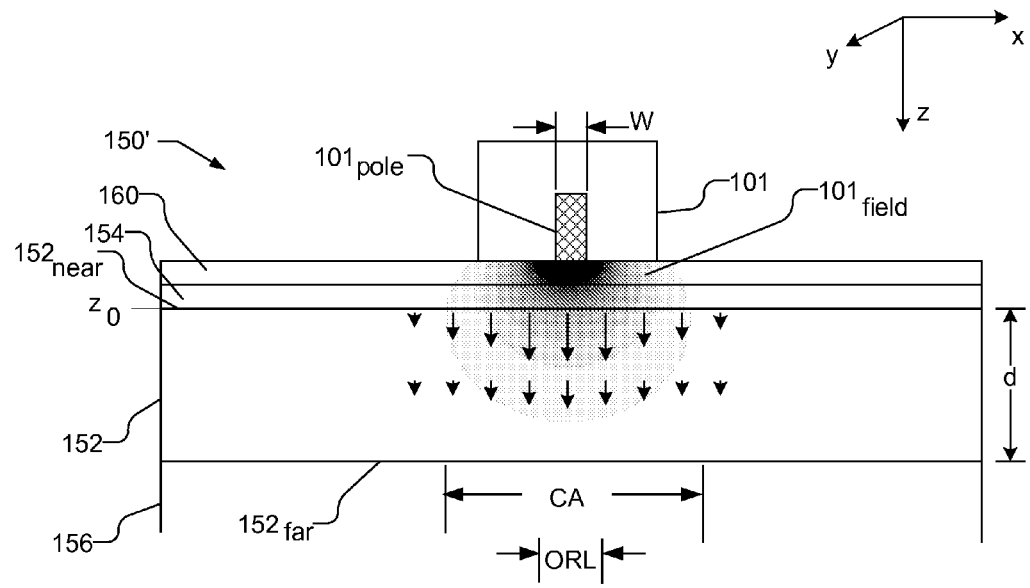
FIGS. 4B and 4C illustrate a cross-sectional view of a magneto-optical transducer, including a ferrimagnetic garnet film and a reflective layer and overlying magnetic layers, along with a sample in the form of a write head, including a write pole.
Figure 4C:
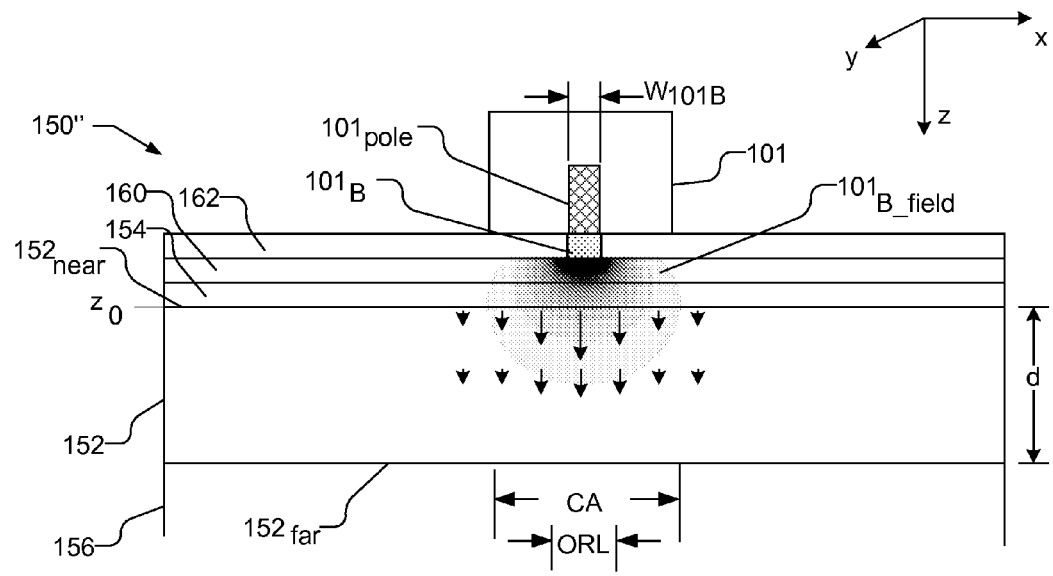
Figure 4D:
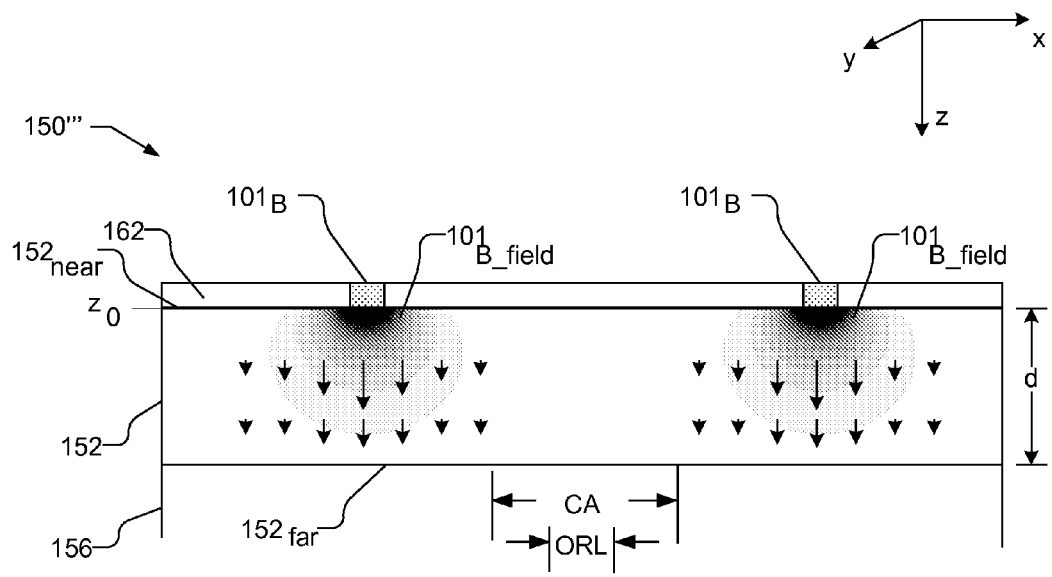
FIG. 4D illustrates a cross-sectional view of a magneto-optical transducer with an overlying magnetic recording layer with multiple written bits that remain after the sample is removed.

FIG. 3D illustrates a projection of magnetic field producing structure when the magnetic field producing structure is a bit imprinted on a magnetic recording layer 162 that overlies the magnetic layer 152, such as that shown in FIGS. 4C and 4D. By way of example, when the sample 101 is a HAMR write head, the written imprint on the magnetic recording layer 162 is caused by simultaneously heating the magnetic recording layer 162 with, e.g., a laser, and applying a magnetic field by the write pole. Thus, unlike a conventional write head, the shape of the imprint on magnetic recording layer 162 is determined by the shape of the heated area, which because it is produced by a laser and aperture, will most likely be shaped as a circle $101_{bit}$ or ellipse (if the laser is at an angle with respect to the magnetic recording layer 162), or some other laser/aperture dependent shape, regardless of the shape of the write pole of the head. Thus, the longest linear dimension of the magnetic field producing structure $101_{bit}$ is the diameter (D) of the circle or the longest axis of an ellipse.

FIG. 4A illustrates a cross-sectional side view of the magneto-optical transducer 150, including a magnetic layer 152 that is, e.g., a ferrimagnetic garnet film 152, and a reflective layer 154, along with a write head sample 101 that includes a write pole $101_{pole}$ that produces a magnetic field $101_{field}$. FIGS. 4B and 4C are similar to FIG. 4A but illustrate another embodiment of the magneto-optical transducer. Referring to FIG. 4A, the ferrimagnetic garnet film 152 has an in-plane magnetization, which is disturbed by the perpendicular component of the magnetic field $101_{field}$ along the optical axis that is produced by the write pole $101_{pole}$ to induce an out-of-plane rotation of the magnetization of the magnetic layer 152. The vertical component of the magnetization of the magnetic layer 152 is illustrated by arrows 152v1 and 152v2. Areas with an out-of-plane rotation of the magnetization of the magnetic layer 152 can be optically detected by the polarization microscope, e.g., illustrated in FIG. 1A, as a contrast with areas having no out-of-plane rotation, herein referred to as a magneto-optic contrast. Thus, the effect of the magnetic field $101_{field}$ on the magnetization of the magnetic layer 152 can be optically detected by device 100 as a magneto-optic contrast if the affected area is larger than the optical resolution limit of the optics of the device 100.

However, the source of the magnetic field $101_{field}$, e.g., sample 101, has a magnetic field producing structure, e.g., write pole $101_{pole}$, with a projection $101_{projection}$ that has a largest linear dimension illustrated as W, that is below the optical resolution of the optics of the device 100, illustrated as ORL in FIG. 4A.

It should be understood that the write pole $101_{pole}$ may have one or more dimensions, such as its height, that is greater than the optical resolution limit of the optics of the device 100, however, the largest linear dimension of the projection of the magnetic field producing structure is below the optical resolution limit of the optics. By appropriate configuration of the device 100, the area of the magnetic layer 152 of the magneto optical transducer 150 that is affected by the magnetic field $101_{field}$ to produce a Contrast Area (CA) on the magneto optical transducer 150 has a linear dimension that is large enough to be resolved by the optics of the device 100. The device 100 may be configured to produce a large Contrast Area (CA), e.g., by holding the sample 101 close to the magnetic layer 152 by limiting the thickness of any intervening layers, including the reflective layer 154 and any protective layer 158 (shown in FIG. 2A), to less than, e.g., the largest linear dimension of the projection of the field producing structure. By way of example, the sample 101 may be held less than approximately 100 nm from the magnetic layer 152. Additionally or alternatively, the saturation field of the magnetic layer 152 is configured to be sufficiently lower than the magnetic field produced by the sample 101 so that the area of change in magnetization in the magnetic layer 152, e.g., CA, is larger than the optical resolution of the optics ORL of the device 100. By way of example, when the optics of the device 100 have an optical resolution limit of 624 nm or even down to 275 nm, and the magnetic layer 152 is a garnet film, the saturation field of the magnetic layer 152 may be at least one order of magnitude lower than the magnetic field produced by a write head sample 101, or at least 50% lower in the case of a resolution limit of 275 nm. For a given optical resolution limit of 624 nm or even down to 275 nm, the saturation field of a magnetic layer 152 of, e.g., NiCr, NiFeCr, NiFe, CoFe, or CoNiFe, may be at least 30% lower than the magnetic field produced by the write head sample 101. If the spacing between the sample 101 and the magnetic layer 152 is greater than the largest linear dimension of the projection of the field producing structure, the saturation field of the magnetic layer 152 may be appropriately reduced to produce an area of change in magnetization in the magnetic layer 152, e.g., CA, that is larger than the optical resolution of the optics ORL of the device 100.

As illustrated in FIG. 4A, the magnetic field $101_{field}$ that is produced by the magnetic field producing structure of the sample, e.g., the write pole $101_{pole}$, is small and has a sharp field gradient in the z-direction so that the garnet magnetization does not uniformly saturate through the thickness d of the magnetic layer 152, e.g., when a garnet film is used as the magnetic layer 152. For example, as can be seen in FIG. 4A, the particular component of the magnetic field $101_{field}$ is significantly different at the surface $152_{near}$ the sample 101 with respect to the surface $152_{far}$ opposite the sample 101. The sharp gradient of the magnetic field $101_{field}$ results in a non-uniform rotation of the magnetization (saturation) through thickness of the magnetic layer 152 as indicated by the lengths of the vertical components of the magnetization of the magnetic layer 152 illustrated as arrows $152v1$ and $152v2$. In other words, while the magnetic layer 152 directly under the sample 101 is fully saturated at the surface $152_{near}$ near the sample 101, the magnetic layer 152 directly under the sample 101 is not fully saturated at the opposite surface $152_{far}$. Thus, at a location directly under the write pole $101_{pole}$, the magnetization of the magnetic layer 152 has some in-plane field orientation, e.g., at the surface $152_{far}$. Moreover, even if the magnetic field $101_{field}$ is extremely high with respect to the saturation field of the magnetic layer 152, the magnetic layer 152 will not fully saturate, i.e., some in-plane field orientation is retained, at the location that corresponds to the center of the write pole $101_{pole}$, because the separation $z_0$ between the write pole $101_{pole}$ and the magnetic layer 152 and the thickness d of the magnetic layer 152 are large relative to the rate of decay of the magnetic field $101_{field}$. Thus, the separation between the sample and the magnetic layer, e.g., the thicknesses of the reflective layer 154 and any protective layer 158, the thickness of the magnetic layer 152 and the saturation field of the magnetic layer 152 may be configured so that at no location of the magnetic layer 152 is fully saturated through the thickness of the magnetic layer, i.e., from surface $152_{near}$ to surface $152_{far}$. Accordingly, there is a non-uniformity in the magnetization through the thickness of the magnetic layer 152. For example, with a high magnetic field $101_{field}$ from the sample relative to the saturation field of the magnetic layer 152, the magnetic layer 152 will be saturated if the distance between the sample and a particular point in the magnetic layer 152 is smaller than the largest linear dimension of the projection of the sample $W_{pole}$, which may be 100 nm. Thus, if the reflective film 154 and protective layer 158 have a combined thickness, e.g., distance $z_0$, of less than the width of the sample, approximately 100 nm, the near surface $152_{near}$ of the magnetic layer 152 will be saturated. With a magnetic layer 152 having a thickness d of 0.3 μm to 5 μm, the distance from the sample will be sufficient that the opposite surface $152_{far}$ will not be saturated. The non-uniform rotation of the magnetization through the thickness of the magnetic layer 152 can be used to detect variations in the performance of different samples, i.e., discriminate sample performance, as well be used to determine field magnitude and sample geometry.

FIG. 4B is similar to FIG. 4A, like designated elements being the same. The magneto-optic transducer 150' of FIG. 4B, however, has a magnetic film 160 between the write head sample 101 and the magnetic layer 152. In one embodiment, as illustrated in FIG. 4B, the magnetic film 160 is deposited over the reflective layer 154. In another embodiment, however, where the magnetic film 160 is sufficiently reflective, the magnetic film 160 may take the place of the reflective layer 154, i.e., reflective layer 154 is not used. The magnetic film 160 may not be as reflective as the reflective layer 154, but by removing the reflective layer 154 and relying on the magnetic film 160 as the reflective layer, the sample 101 will be closer to the magnetic layer 152, and thus, may provide a net benefit. The magnetic film 160 may be similar to a soft underlayer (SUL) used on a perpendicular magnetic recording medium to be used with the write head sample 101. The SUL magnetic film 160 may be deposited on the reflective layer 154, or the magnetic layer 152 where the reflective layer 154 is not used, by sputtering or other conventional technique and may require the use of an appropriate seed layer. The use of a magnetic film 160 on the magneto-optic transducer 150' may be advantageous as it more closely simulates the actual operation of the write head sample 101, e.g., by providing a path for the magnetic field to return to the write head sample 101. The sample 101 may produce a magnetic field, which produces a magnetic field in the SUL magnetic film 160. The resulting magnetic field $160_{field}$ changes the magnetization of the magnetic layer 152 to an area CA that is greater than the optical resolution limit ORL of the optics of the device 100. Thus, the effect of the magnetic field from the sample 101 may be imaged for analysis via the magneto-optical transducer 150 that includes the magnetic SUL film 160.

FIG. 4C is similar to FIG. 4B, like designated elements being the same. FIG. 4C, however illustrates a magneto-optical transducer 150" that includes an additional magnetic layer 162, similar to a recording storage layer on a perpendicular magnetic recording medium to be used with the write head sample 101. The magnetic recording layer 162 may be deposited over the SUL magnetic film 160 using conventional techniques used in the disk drive industry. It should be understood that additional layers may be present, such as a separation layer between the SUL magnetic film 160 and the magnetic recording layer 162. Alternatively, one or both of the reflective layer 154 and the SUL magnetic film 160 may be removed. For example, the magnetic recording layer 162 may be deposited directly on the magnetic layer 152, via a seed layer, without the underlying SUL magnetic film 160 or the reflective layer 154, e.g., when the magnetic recording layer 162 is sufficiently reflective. The use of the magnetic recording layer 162 on the magneto-optic transducer 150' again may be advantageous as it more closely simulates the actual operation of the write head sample 101. A magnetic field produced by the write head sample 101 writes a bit $101_B$ to the magnetic recording layer 162, as illustrated in FIG. 4C. The magnetic bit $101_B$ is typically about the size of the write pole $101_{pole}$, or smaller, such as with HAMR type write heads, and has an area $W_{101B}$ below the optical resolution ORL of the optics. The resulting magnetic bit $101_B$, however, produces a magnetic field $101_{B\_field}$ that through the magnetic SUL film 160 changes the magnetization of the magnetic layer 152 in an area CA that is greater than the optical resolution limit ORL of the optics of the device 100. Thus, as illustrated in FIG. 4C, the recorded magnetic bit $101_B$ acts as the magnetic field producing sample and the magnetic field produced by the magnetic bit $101_B$ can be imaged via magneto-optic transducer 150", from which information about the magnetic bit $101_B$ and, thus, the write head sample 101 that produced the magnetic bit $101_B$ can be obtained. The use of the magneto-optic transducer 150" with the SUL magnetic film 160 and magnetic recording layer 162 may be advantageous to determine performance characteristics of write heads, such as the magnetic write width. Moreover, magneto-optic transducer 150' may be used with HAMR type write heads to measure the performance of the non-magnetic thermal element. It may be useful when the magneto-optic transducer 150" includes a magnetic recording layer 162 to write to the magnetic recording layer 162 twice at different polarities, where the magnetic bit $101_B$ is cleared between writing using AC ring-down by the sample 101, or the magnetic field source 196 or by a magnetic source external to device 100. As discussed above, a DC bias may be applied to the magnetic recording media, e.g., by the magnetic field source 196 or by a magnetic source external to device 100, where a bit is written with opposite polarity, in order to maximize the magneto-optic contrast.

The use of the magnetic recording layer 162 has the advantage that the bit $101_B$ can be written offline, and the magneto-optic transducer 150" can be imaged later as an assembly. Alternatively, the sample 101 may be loaded, the bit $101_B$ written, and the sample unloaded and the bit $101_B$ imaged later, which is advantageous as the remanence from the write pole does not impact the analysis of the written-bit. Additionally, the throughput may be improved by imaging the written bit while unloading and loading the next test sample. Further, without the magnetic recording layer 162, a static bias is applied to the sample (writer) during imaging, which may be approximately 50 ms with a typical CCD camera. The characteristics of the writer/electromagnet may be different during AC/pulsed writing vs. DC writing, due to characteristics in the write driver such as Overshoot. Thus, with the use of the magnetic recording layer 162, real write conditions are simulated as close as possible by using a single pulsed write bias to write the bit $101_B$. Further analysis is also possible by measuring the size of the written bit $101_B$ as a function of write pulse duration. Additionally, the device could be used as a media analysis tool as opposed to a write head tester. In other words, the magneto-optical transducer 150" may be used to compare different media properties, e.g., by using two or more types of media as the magnetic recording layer 162 and comparing the resulting written bit produced with the same or similar write heads.

FIG. 4D is similar to FIG. 4C, like designated elements being the same. FIG. 4D, however, illustrates the magneto-optical transducer 150'" with the magnetic recording layer 162 directly on the magnetic layer 152, i.e., with no intervening layers, except any seed layer necessary for deposition, which for purposes of this disclosure is not considered an intervening layer. As can be seen in FIG. 4D, multiple bits $101_B$ may be written to the magnetic recording layer 162 and the bits $101_B$ remain after the sample 101 is removed. For example, the bits may be written at different location by moving the sample 101 or the magneto-optical transducer 150'" using actuator 190. The bits $101_B$ can then be imaged without the presence of the sample 101. It should be understood that multiple bits $101_B$ may also be written on magneto-optical transducer 150", which includes magnetic layer 162 over the SUL magnetic film 160 as shown in FIG. 4C. Thus, with magneto-optical transducer 150'", it is possible to test a write field response, e.g., while a write current is produced to the sample 101, and to test for remanence. For example, the write field response of the magnetic layer 152 to a write current provided to a sample 101 may be imaged while the write current is produced. The remanence could not be imaged at the pole because a bit will be written in the magnetic recording layer 162 directly under the pole, unless the write current used during the write field response measurement is chosen to be less than the coercivity of the magnetic recording layer 162 so that a bit is not actually written to the magnetic recording layer 162. Additionally, after the write field response test a bit field response test may be performed, i.e., testing the field produced by the written bit on magnetic recording layer 162, before and/or after moving the sample 101. One possibility is writing with the sample 101 with the opposite polarity to clear the bit from the magnetic recording layer 162, by reorienting the bit back in the same direction as the initialized media. This would not require an external magnet to erase the bit. Additionally, write current sweeping may be performed and tested. For example, a write current sweep may be used to clear the bit. By increasing the write current, there may be no need to erase the bit between steps in the write current sweep, for example, if the bit intensity is measured during the sweep, where the written area will continue to increase in size proportionally to write current so that absolute and relative increases in the magneto-optic contrast may be measured. After stopping the write current, the sample 101 may be optionally unloaded and the bit recorded on the magnetic recording layer 162 imaged after unloading the sample 101.

Thus, as illustrated in FIGS. 4A, 4B, 4C, and 4D, the effect of the magnetic field produced by the write pole $101_{pole}$ can be optically detected by the device 100 and using the optically detected information, desired characteristics of the sample 101 can be determined. For example, the optically detected magneto-optic contrast may be used to distinguish between nominal write head performance and heads with severe magnetic or mechanical problems including corrosion of the write pole. For example, by comparing the optically detected contrast to a threshold or a reference value, it can be determined if the sample is good. Moreover, through appropriate data processing, the optically detected magneto-optical contrast may be used to provide quantitative information on the field strength and to extract pole dimensions. Additional information that may be determined include overwrite (OW) and magnetic write width related information, head efficiency, saturation, pole remanence, missing or corroded write pole, variation of physical pole dimensions, and write gap variation. Additionally, information may be obtained for magnetic recording media.

Figure 5:
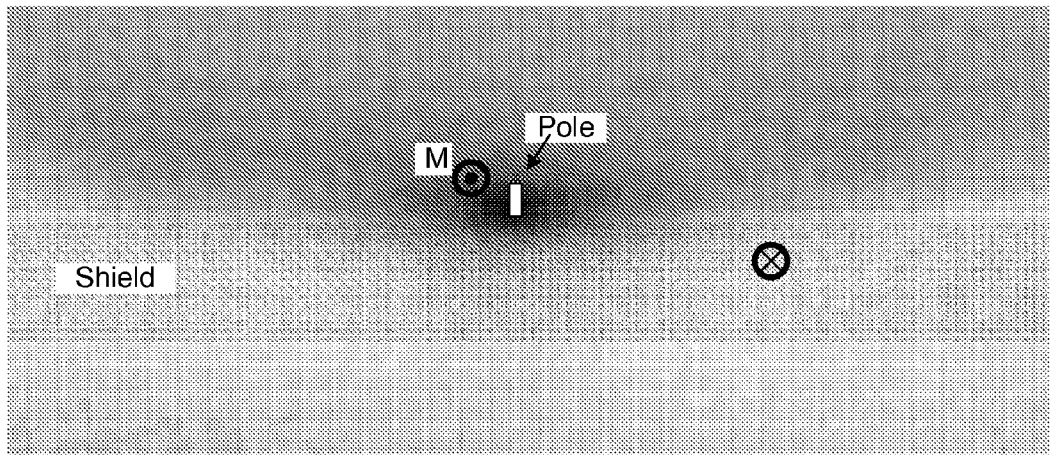
FIG. 5 illustrates an example of a magneto-optic contrast image from a magneto-optical transducer.

FIG. 5 illustrates an example of a magneto-optic contrast image from a magneto-optical transducer 150. In FIG. 5, the darker areas correspond to the field components from the sample, e.g., the write pole, that are pointing into the plane, whereas the lighter contrast are field components that are pointing out of the plane. The image shows the magneto-optic contrast produced by the magnetic field from a write pole, which is illustrated by a solid box (not drawn to scale), where field components pointing into and out of the plane create a magneto-optic contrast and the intensity of the contrast is proportional to the field strength. Also illustrated in FIG. 5 is the effect on the magnetization of the magneto-optical transducer caused by the magnetic field from the shield of the write head, where both the pole and the shield are physically located on the opposite side of the magneto-optical transducer.

Figure 6:
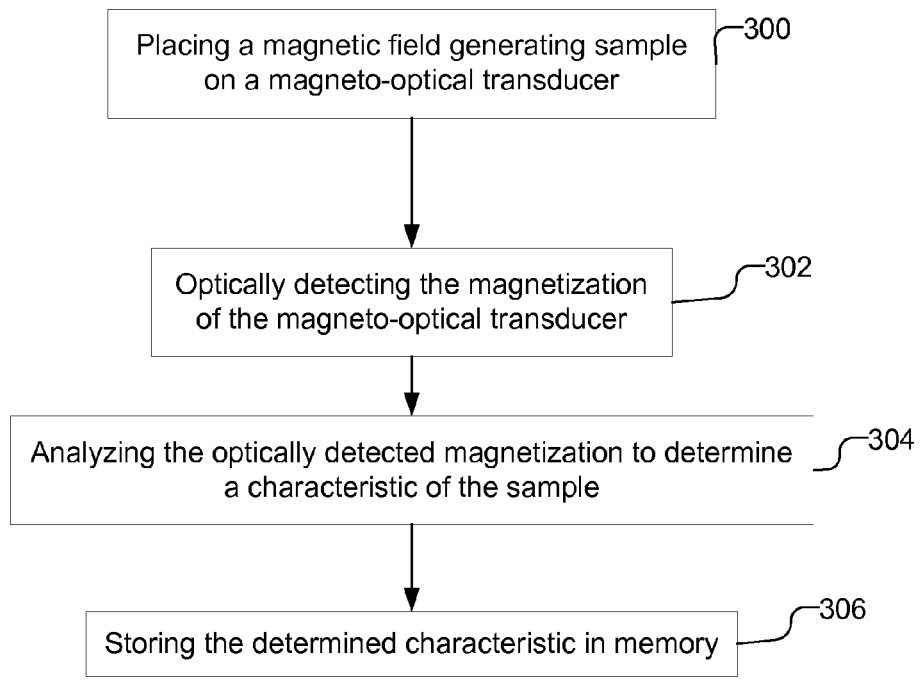
FIG. 6 is a flow chart illustrating an embodiment of measuring a characteristic of a magnetic field generating sample using a magneto-optical transducer.

FIG. 6 is a flow chart illustrating an embodiment of measuring a characteristic of a magnetic field generating sample using a magneto-optical transducer. The magnetic field generating sample is placed on a magneto-optical transducer (300) that has a saturation field that is lower than the magnetic field of the sample so that the area CA of the transducer that is affected by the magnetic field is optically resolvable, when the magnetic field generating structure is below the optical resolution ORL of the optics of the device 100. While the magnetic field generating sample is producing a magnetic field, e.g., while applying a write current to a write head, the effect of the magnetic field on the magnetization of the magneto-optical transducer is optically detected (302). By way of example, the magnetization of the magneto-optical transducer may be imaged using a camera or the intensity of the light detected, using a photodetector. If desired, the magnetization of the magneto-optical transducer may be optically detected when different write currents are applied to the sample. For example, to increase the magneto-optic contrast, the magnetization of the magneto-optical transducer may be optically detected for negative and positive write currents and the two optically detected magnetizations are subtracted to eliminate light that has no magnetic information, which can also be done for different absolute magnitude write currents. Further, if desired, the magnetization of the magnet-optical transducer may be optically detected for zero write current (e.g., with or without the sample present) which is then subtracted from subsequent optically detections of magnetizations to eliminate light that has no magnetic information, which can also be done for different absolute magnitude write currents. Additionally, if desired, the magnetization of the magneto-optical transducer may be optically detected while exercising the DFH device or a microactuator device that may be present on a write head sample. Further, the temperature of the sample may be controlled, e.g., cooled or heated, while optically detecting the magnetization. Also, an external bias field may be applied, and in the case that the magnetic recording layer 162 is used, the external bias can be used to saturate the magnetic recording layer 162 in one direction or randomly with AC erasure.

The optically detected magnetization can then be analyzed to determine a characteristic of the magnetic field sample (304). For example, the optically detected magnetization, or at least a portion of the data, can be compared to a threshold, a reference value, or a library of information, which may be produced empirically or theoretically by modeling. The determined characteristic can then be stored in memory, e.g., memory 134 in processor 130 (306) or otherwise reported, e.g., displayed by display 136. It should be understood that storing the determined characteristic in memory may be long term storage of data or it may be temporarily stored, for example, in order to display the result on a monitor or print the result. The determined characteristic can be used to, e.g., accept or reject samples with unsatisfactory characteristics or to separate, e.g., bin, samples based on performance. Further, the determined characteristics may be used in process feedback control in the production of samples. Additionally, the determined characteristics may be used in the evaluation and/or comparison of sample designs.

Figure 7:
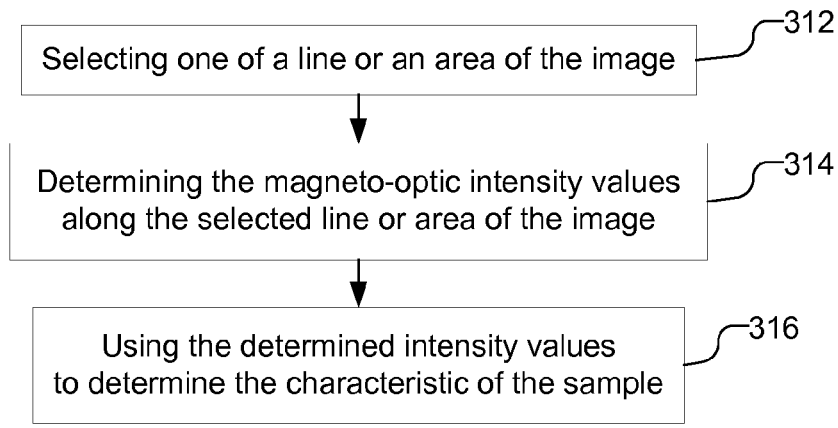
FIG. 7 is a flow chart illustrating an embodiment of the analysis of the image that may be performed.

FIG. 7 is a flow chart illustrating an embodiment of the analysis of the optically detected magnetization that may be performed. Once the magneto-optic contrast is optically detected, the area of interest is found by selecting, e.g., a line or area of an image (312). The selection of a line or an area is based on the type of analysis to be done. Moreover, area of interest may be selected based on the location of the magnetic field producing structure, which may be determined based on the greatest intensity in the magneto-optic contrast. The intensity of the magneto-optic contrast along the selected line or within the area is then determined (314). If desired, the intensity of the magneto-optic contrast may be normalized, e.g., by determining a intensity ratio, offset or some combination. For example, the intensity of the magneto-optic contrast along the selected line or within the area may be relative to another intensity value to form a contrast ratio. The contrast ratio could be with respect to, e.g., a different portion of the selected line or area but at a suitable distance from the sample that it is not affected by a field from the sample, or from a different portion of the same image altogether, e.g., in a corner of the image, or a previous reference image. Alternatively, an offset may be used by subtracting a baseline measurement derived from another portion of the line, area, or other image from the measured intensity of the magneto-optic contrast. In one embodiment, a magneto-optic contrast line profile may be produced. The determined intensity values can then be used to determine the desired characteristic of the sample, e.g., by comparing the intensity to a threshold or reference values, a library of information, which can be generated empirically or theoretically by modeling (316). Moreover, the determined intensity value(s) may be used to calculate desired characteristics such as geometrical information. A normalized magneto-optic contrast distribution may be fit to a magneto-optic model to extract geometrical and field intensity data. For example, the 50% half-width of a normalized line profile may be used to calculate desired geometrical information. In another example, the intensity of the magneto-optic contrast over an area, e.g., that coincides with the approximate location and area of the write pole, may be averaged to determine a peak intensity, which may be used to determine a characteristic of the write pole such as whether it is functioning or to determine other characteristics. Further, a contrast gradient may be calculated, e.g., using intensity values derived from optically detected magnetization values produced at different write currents. Another analysis may be the deconvolution of the optical resolution of the optics from the magneto-optic contrast image. Another analysis may be a subtraction of stray fields coming from the flare of the writer, or from remanences or domains, or other field sources that may be subtracted from the contrast to further distinguish the field produced from the write pole.

As discussed above, a library may be generated empirically or theoretically by modeling. Modeling techniques may also be used to calculate certain characteristics of a sample. For example, by knowing specific parameters, such as the saturation field and thickness of the magnetic layer 152, along with the separation between the sample and the magnetic layer 152 and optical parameters of the optical elements of the device 100, geometrical dimension of a sample may be calculated once the magnetic field of the sample is determined.

Figure 8A:
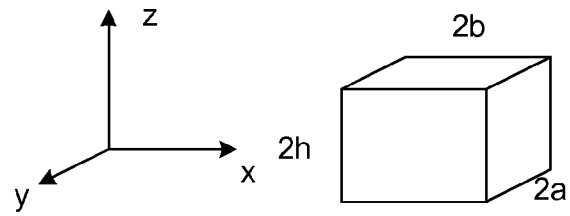
FIGS. 8A and 8B illustrate a magnetized cube and write pole field that can be used to model the magneto-optic contrast.
Figure 8B:
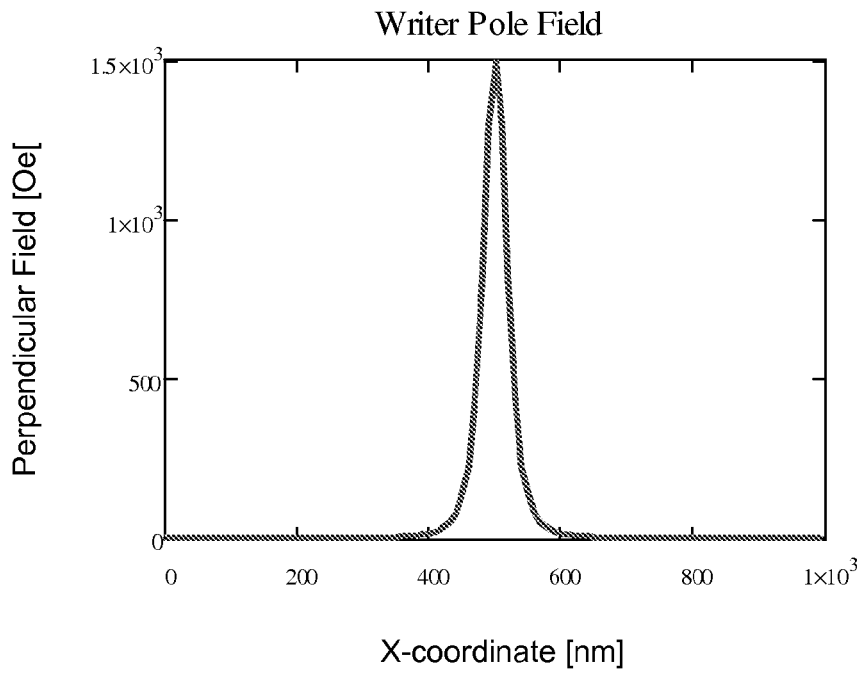

In order to model the optically detected magnetization from the magneto-optical transducer 150, the dimensions of a magnetized cube (modeling a write pole), as illustrated in FIG. 8A is produced and the three dimensional field for the magnetized cube is calculated, e.g., based on the Biot-Savart Law, or other appropriate means. By way of example, FIG. 8B illustrates the perpendicular magnetic field produced by the magnetized cube of FIG. 8A along the x-coordinate.

With the magnetic field from the structure calculated, the magnetic field is averaged over the magnetic layer thickness based on the thickness of the magnetic layer 152 (i.e., thickness d shown in FIG. 4) and the separation between the sample and the magnetic layer 152 (distance $z_0$ shown in FIG. 4) as follows:

$$Hav(x, y) := d^{-1} \cdot \int_{z0}^{z0+d} Hz(x, y, z) dz.  \quad \text{Equation 2}$$

Moreover, the effect that the magnetic field has on the magnetization of the magnetic layer 152, e.g., the magneto-optic contrast, can be determined as:

$$MO(x,y) \propto Hav(x,y)|_{H(x,y,z) \leq Hsat,garnet} \quad \text{Equation 3}$$

where Hsat,garnet is the saturation field of the magnetic layer 152.

Figure 9:
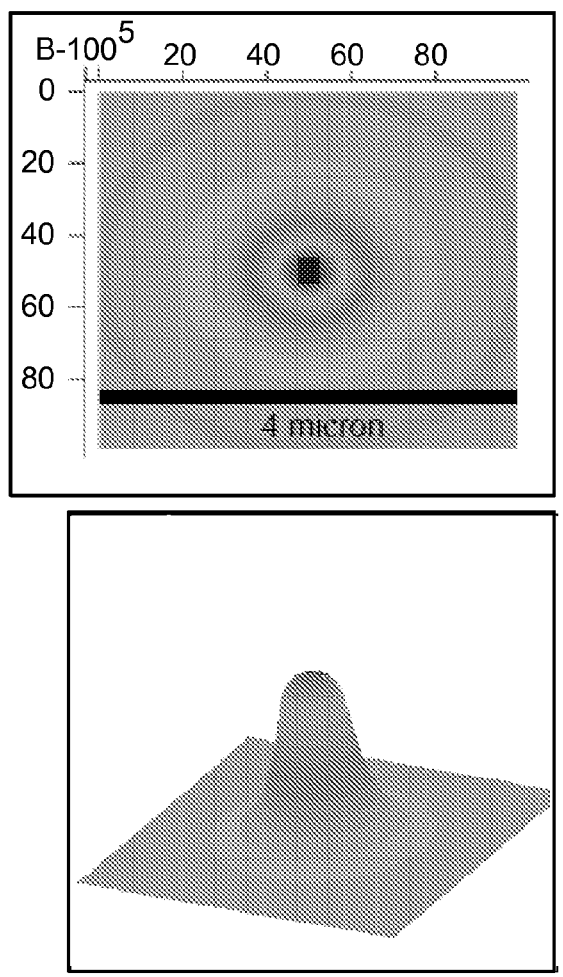
FIG. 9 illustrates 2-D and 3-D graphs of the calculated magneto-optic contrast of the write pole field as imaged using a magneto-optical transducer.

FIG. 9 illustrates the modeled magneto-optic contrast that may be imaged using the magneto-optical transducer 150 when exposed to a magnetic field from the modeled write pole. The calculated magneto-optic contrast is based on a write pole having a width w of 220 nm, the magnetic layer 152 having a thickness d of 1000 nm, and a spacing $z_0$ of 40 nm from the write pole, and a magnetic field H from the write pole of 1.8 Tesla, and a magnetic layer 152 saturation $H_{sat}$ of 750 Oe. It has been determined that the magneto-optical spatial contrast resolution is not diffraction limited, but is mainly determined by the magnetic layer 152 thickness d and the spacing $z_0$ between the magnetic layer 152 and the sample, e.g., the thickness of the reflective layer 154.

Figure 10:
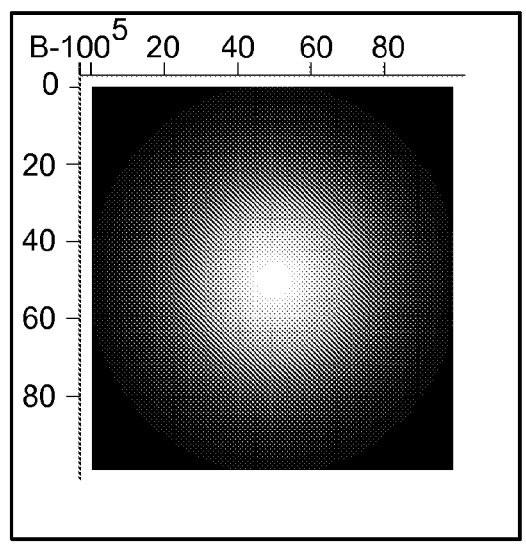
FIG. 10 illustrates the optical resolution of the optics that is modeled using a Gaussian spatial function.

The optics in the polarization microscope have a limited optical resolution. FIG. 10, for example, illustrates the optical resolution of the optics that are modeled using a Gaussian spatial function S, where half-width s=600 nm, as follows:

$$S(x, y) = \frac{1}{s\sqrt{\pi/2}} \cdot e^{-2\left(\frac{x^2+y^2}{s^2}\right)} \quad \text{Equation 4}$$

The modeled magneto-optic contrast distribution, thus, must be modified based on the optical resolution. Thus, to determine the expected image of the magneto-optical transducer the convolution of the Gaussian function with the magneto-optic contrast distribution may be calculated as:

$$f(x,y) = \iint S(x_s, y_s) \cdot Hav(x-x_s, y-y_s) dx_s dy_s \quad \text{Equation 5}$$

Figure 11A:
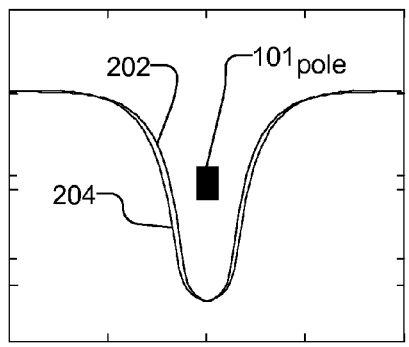
FIGS. 11A and 11B are graphs illustrating modeled calculations of the impact of the magnetic field variation and the width of the magnetic structure on the imaged magneto-optic contrast, respectively.
Figure 11B:
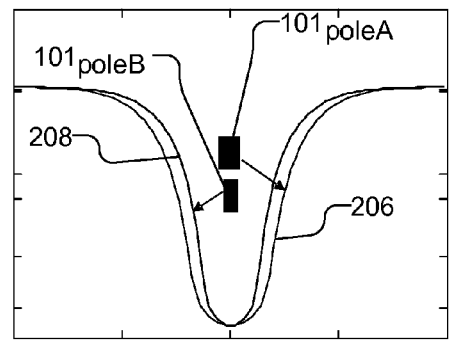

FIGS. 11A and 11B are graphs illustrating modeled calculations of the impact of the magnetic field variation and the width of the magnetic structure on the imaged magneto-optic contrast, respectively. FIG. 11A illustrates a curve 202 calculated based on a write pole $101_{pole}$ with a width of 122 nm and a field amplitude of 1.8 T and a curve 204 calculated based on the same size write pole $101_{pole}$ and a field amplitude of 2.6 T. FIG. 11B illustrates two curves 206 and 208 that were calculated based on write poles $101_{poleA}$ and $101_{poleB}$ having respective widths of 122 nm and 84 nm and the same magnitude magnetic field amplitudes of 1.8 T. As can be seen, the write-field strength and the pole width have a different impact on the magneto-optic contrast distribution and, thus, can be treated as independent variables when fitting data to the model. Thus, dimensional information of the sample may be extracted by analyzing the contrast intensity of a selected area of the magneto-optic contrast image.

Figure 12:
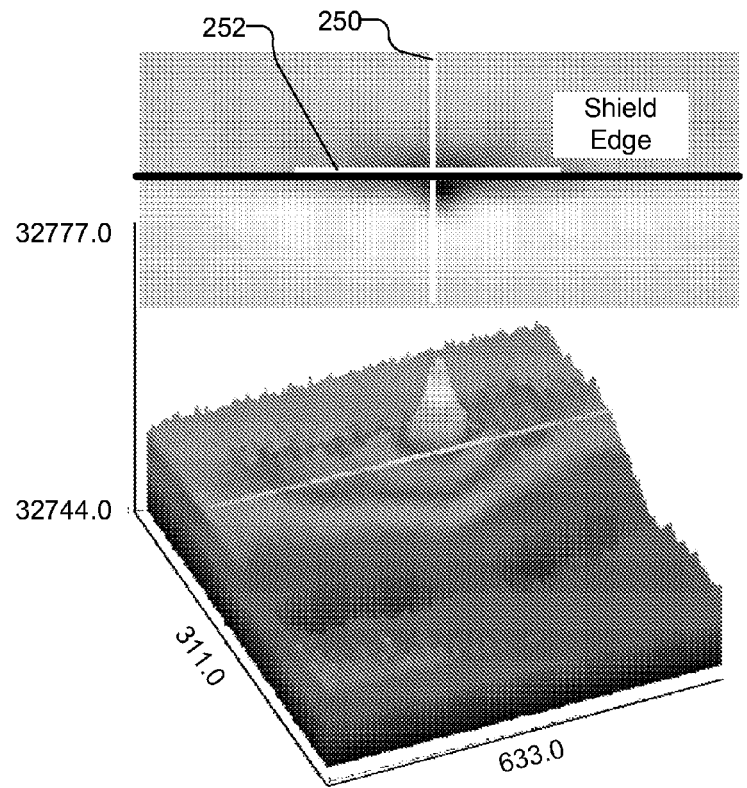
FIG. 12 shows an image of the magneto-optic contrast of a write head sample along with a 3-D rendering.

FIG. 12 shows an image of the magneto-optic contrast of a write head sample along with a 3-D rendering. The magneto-optic contrast is for a write head with a write pole of approximately 100 nm and a write current of 50 mA. The edge of the shield of the write head is also illustrated for orientation.

Figure 13:
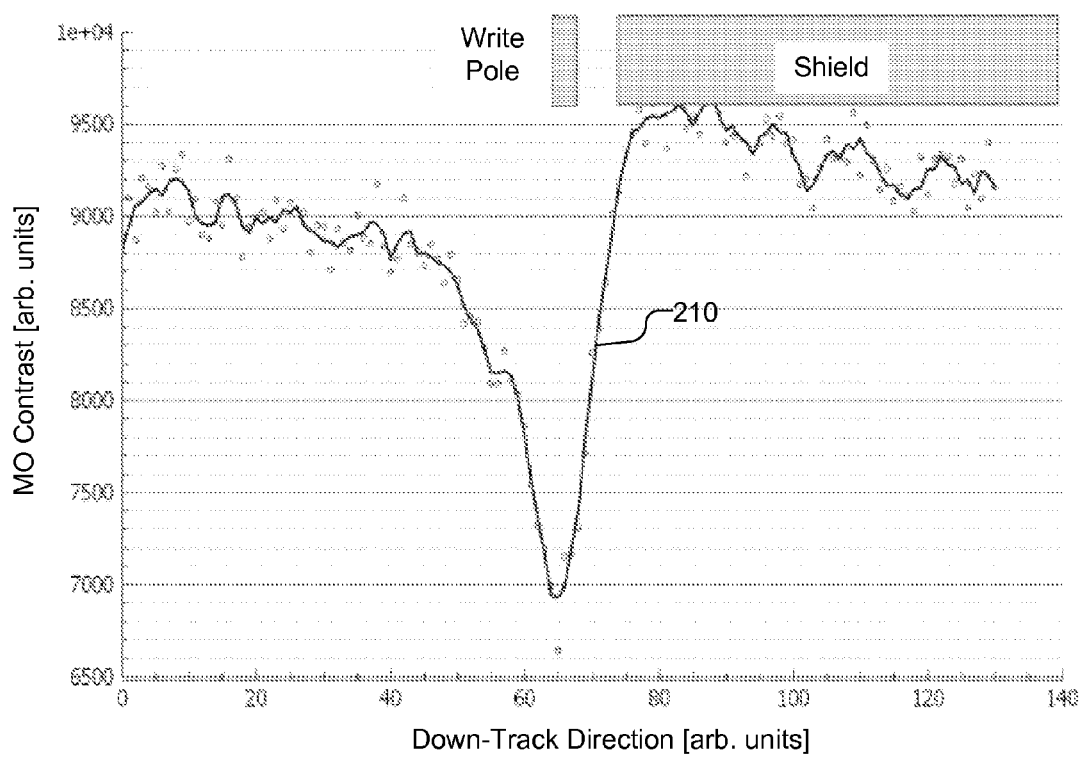
FIG. 13 is a graph illustrating the down track line profile of the magneto-optic contrast, where the x-axis represents the down-track direction and the y-axis represents the magneto-optic contrast.

FIG. 13 is a graph illustrating the measured down track line profile of a magneto-optic contrast, where the x-axis represents the down-track direction and the y-axis represents the magneto-optic contrast. The line profile is taken along a magneto-optic contrast image in the direction illustrated by line 250 in FIG. 12. The approximate positions of the write pole and the shield are also illustrated in FIG. 13 for the sake of reference. Using the line profile, several characteristics of the sample may be determined. For example, the amplitude of the line profile provides information related to the field strength. By comparing the measured amplitude to reference values, e.g., in a library, or through modeling, the measured contrast values can be used to determine the strength. Moreover, the write gap, i.e., the gap between the write pole and the shield, may be determined from the line profile based on the slope of the line at 210, i.e., between the peak that corresponds to the write pole and the plateau that corresponds to the shield. Additionally, the half-width of the peak may be used to derive dimensional information as discussed above.

Figure 14:
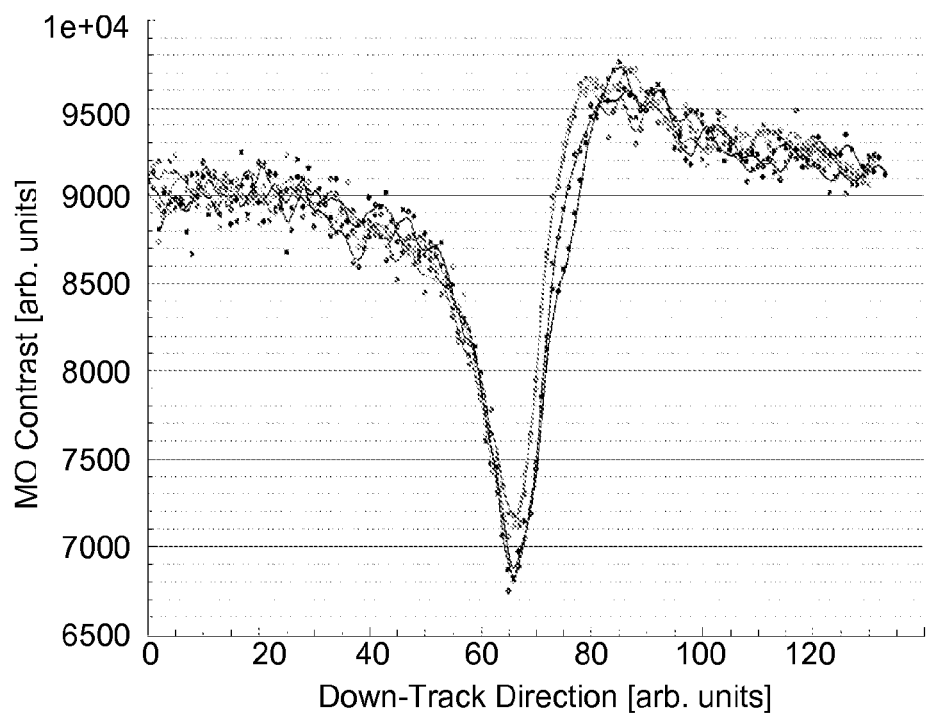
FIG. 14 is a graph, similar to that shown in FIG. 13, illustrating the down track line profile of the magneto-optic contrast for write heads with a different overwrite (OW).
Figure 15:
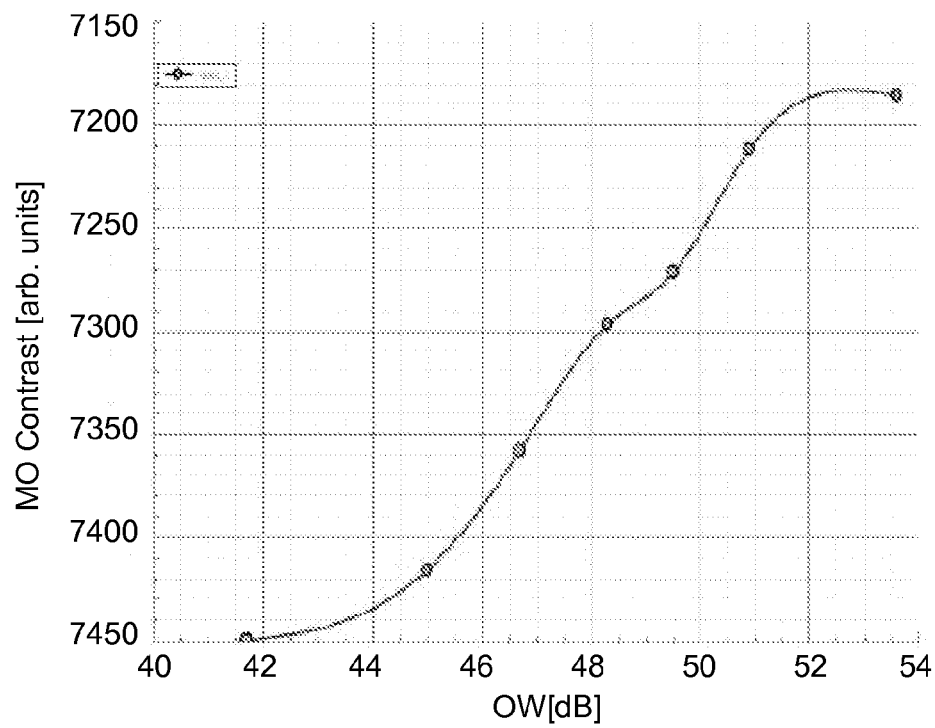
FIG. 15 is a graph illustrating the magneto-contrast as a function of OW from different write heads, where the x-axis represents OW (dB) and the y-axis represents magneto-optic contrast in arbitrary units.

FIG. 14 is a graph similar to that shown in FIG. 13, illustrating the down track line profile of the magneto-optic contrast for write heads with different overwrite (OW). The write heads with low OW show a reduced peak magneto-optic contrast. Similarly, it has been found that write heads with shield corrosion produce a much lower peak contrast compared to good write heads. FIG. 15 is a graph illustrating the magneto-contrast as a function of OW for seven different write heads, where the x-axis represents OW (dB) and the y-axis represents magneto-optic contrast in arbitrary units. The contrast in FIG. 15 was integrated over a small area in the image equivalent to approximately the square of the pole width. Thus, as can be seen, the OW characteristic of a head may be determined based on analysis of the peak magneto-optic contrast. For example, the OW can be determined by comparing the peak magneto-optic contrast of an unknown head to the peak magneto-optic contrast of heads with a known OW. Alternatively, the OW can be characterized by determining the magneto-optic contrast at the pole and comparing the determined contrast to a database of OW versus contrast, such as illustrated in FIG. 15. Magnetic Write Width MWW may be determined in the same manner, since this peak-contrast technique may be used for either/both OW and MWW correlation.

Figure 16:
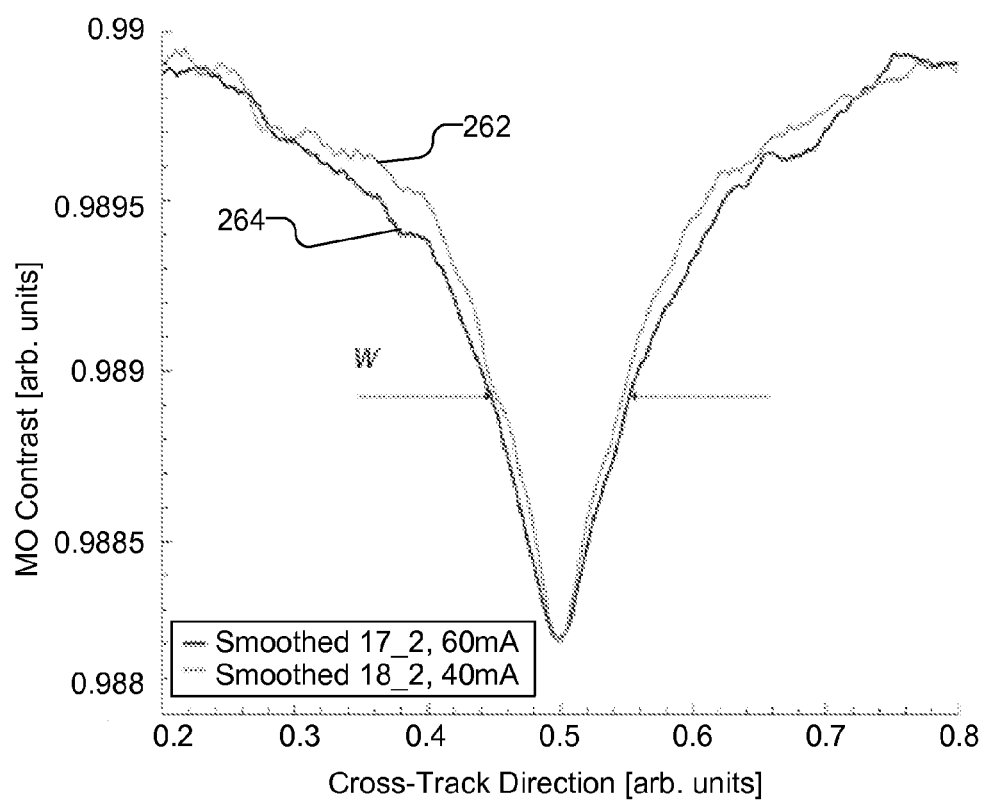
FIG. 16 is a graph that illustrates normalized cross track line profiles of the magneto-optic contrast, where the x-axis represents the cross track direction and the y-axis represents the magneto-optic contrast.

FIG. 16 is a graph that illustrates normalized cross track line profiles of the magneto-optic contrast, where the x-axis represents the cross track direction and the y-axis represents the magneto-optic contrast. The cross track direction is taken along a magneto-optic contrast image in the direction illustrated by line 252 in FIG. 12. Curves 262 and 264 in FIG. 16 represent the magneto-optic contrasts produced by a write head using write currents of 40 mA and 60 mA, respectively.

As can be seen, with the normalized line profiles, the 50% half-width W does not significantly change. In other words, the physical dimensions of the write pole may be extracted from a cross track line profile, such as those shown in FIG. 16, and variations of the write-field and overwrite should have little effect on the extracted physical dimensions. Dimensional information of the sample may be extracted by analyzing the contrast intensity of the selected area with respect to a library of reference data or by e.g., using the determined intensity along with known magneto-optical transducer and optics parameters to calculate the dimensions as discussed above.

Figure 17A:
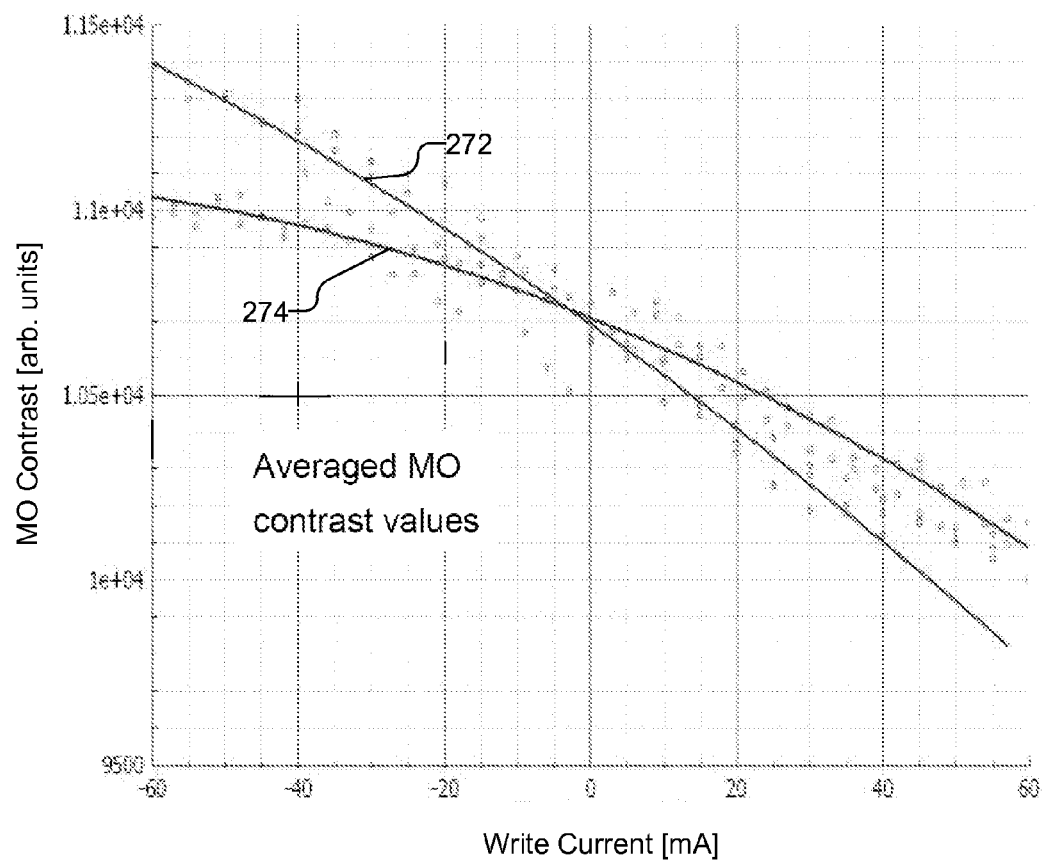
FIG. 17A illustrates a graph of saturation curves for good and bad write heads and FIG. 17B illustrates the selected area of the magneto-optic contrast image that is averaged for different values of write currents to form the saturation curve.
Figure 17B:
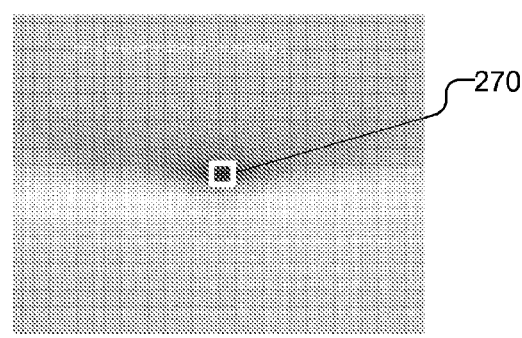

FIG. 17A illustrates a graph of saturation curves for good and bad write heads. FIG. 17A illustrates write current along the x-axis and the magneto-optic contrast along the y-axis. The magneto-optic contrast is averaged over a small selected area of the magneto-optic contrast image, e.g., equivalent to approximately the square of the pole width, as illustrated in FIG. 17B by square 270, for different values of write the write current. The graph illustrates curves for a known good write head, illustrated as curve 272, and a known bad write head, illustrated as curve 274. As can be seen, the curves 272 and 274 are easily distinguished and, therefore, by determining the average contrast for a write head over a small area of the magneto-optic contrast image (that approximately coincides with the write pole) for different write currents, a saturation curve can be generated to measure efficiency and remanence effects of the write head. Remanence is illustrated as an offset from zero in the saturation curve. Thus, one way to determine remanence is apply a write current to write head sample then to optically detect the magnetization when no write current is applied to a write head sample. For example, a positive write current may be applied, followed by optically detecting the magnetization when no write current is applied to a write head sample, then applying a negative write current, again followed by optically detecting the magnetization when no write current is applied to the write head sample. Remanence is the change in the optically detected magnetization, where no change represents no remanence. Efficiency may also be determined from the saturation curves as the ratio of the applied write current and the generated magnetic field.

In one embodiment, polarization modulation may be used by varying the polarization angle of the polarizer 108 and/or the polarizer 116, shown in FIG. 1A. The use of polarization modulation maybe be used advantageously to measure, e.g., remanence effects. For example, without applying a write current, the polarization angle of the polarizer 108 (or polarizer 116) is set to a certain angle, and the magnetization of the magneto-optic transducer 150 is optically detected. After setting the polarizer 108 (or polarizer 116) to a different angle the magnetization of the transducer is measured again and the resulting images are subtracted. Where remanence is present in the write head, a magneto-optic contrast will be detected. The amount of contrast may be used to quantify the remanence. Alternatively, a write current may be applied to the write head first and subsequently reduced to zero to set the write head into a possible remanent state. The above procedure may then be used to detect and measure the remanence.

In one embodiment, the magnetic field source 196 may be used to produce a biasing field or may be adjusted to produce a known magnetic field that is equal in magnitude, but opposite in polarity, to the magnetic field produced by the sample 101 at a certain location, resulting in the magneto-optic contrast being zero at that location, where zero contrast is when the measured intensity is the same as when there is no magnetic field applied to the magneto-optical transducer 150. Thus, when the contrast is zero, at a certain location the magnitude of the magnetic field produced by the sample 101 at this location is known. For example, in one embodiment, a location in the image is selected, e.g., box 270 in FIG. 17B, and the external magnetic field source 196 is adjusted to produce zero contrast at that location. In another embodiment, the external magnetic field source 196 is varied to produce zero contrast at corresponding varying locations to obtain a field magnitude contour.

Figure 18:
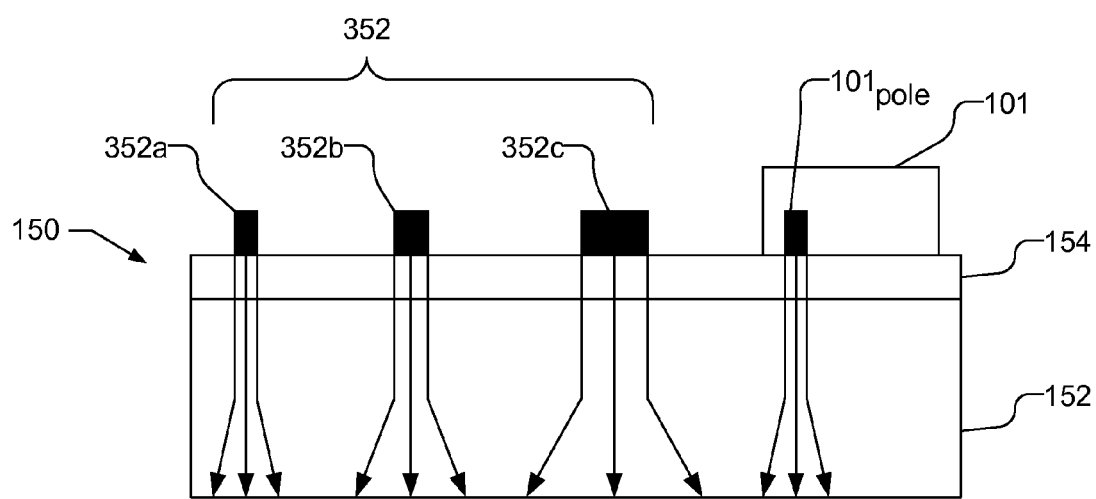
FIG. 18 is a side view of the magneto-optical transducer with reference magnetic field sources.

FIG. 18 is a side view of the magneto-optical transducer 150 with reference magnetic field sources 352a, 352b, and 352c, collectively referred to as sources 352, loaded on the magneto-optical transducer 150. The reference magnetic field sources 352 have known size and field strength parameters. During measurement of a sample 101, illustrated as a write head with a write pole 101$_{pole}$, the effects of the magnetic field from the sample on the magnetization of the magnetic layer 152 may be optically detected along with the effects of the magnetic fields from reference magnetic field sources 352. The resulting magneto-optic contrasts from the sample and the reference magnetic field sources 352 can then be compared to determine desired characteristics of the sample 101. If desired, the reference magnetic field sources 352 may be fixed to the magneto-optical transducer 150 or alternatively, they may be mounted on a loader and loaded onto the magneto-optical transducer 150, e.g., in a manner similar to the sample 101 discussed above. Alternatively, the reference magnetic field sources 352 may be loaded onto the magneto-optical transducer 150 once and used as a calibration tool. Thus, the reference magnetic field sources 352 need not be loaded onto the magneto-optical transducer 150 with every sample 101.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method comprising:
    placing a magnetic field producing sample on a magneto-optical transducer having a magnetic layer, the sample having a magnetic field producing structure with a first extent that produces a magnetic field, the magnetic layer is selected to have a saturation field that is lower than the magnetic field so that the magnetic field causes a change in a magnetization in the magnetic layer over an area having a second extent;
    optically detecting with a polarization microscope the change in the magnetization in the magnetic layer that is caused by the magnetic field, wherein the first extent is smaller than an optical resolution limit of the polarization microscope and the second extent is larger than the optical resolution limit of the polarization microscope;
    analyzing the optically detected change in the magnetization in the magnetic layer to determine a characteristic of the sample; and
    storing in memory the determined characteristic of the sample.

2. The method of claim 1, wherein the sample includes a write head and the magnetic field producing structure is a write pole.

3. The method of claim 2, wherein the write head is in the form of one of a bar, slider, head gimbal assembly or head stack assembly.

4. The method of claim 2, wherein the magneto-optical transducer comprises a magnetic recording storage layer, the method further comprising:
- writing a magnetic bit to the magnetic recording storage layer with the magnetic field produced by the write pole;
- optically detecting with the polarization microscope the change in the magnetization in the magnetic layer that is caused by a second magnetic field from the magnetic bit;
- analyzing the optically detected change in the magnetization in the magnetic layer that is caused by the second magnetic field to determine a characteristic of the magnetic bit; and
- storing in memory the determined characteristic of the magnetic bit.

5. The method of claim 1, further comprising applying a current to the sample causing the magnetic field producing structure to produce the magnetic field.

6. The method of claim 5, wherein optically detecting the magnetization of the magnetic layer with an polarization microscope comprises optically detecting the magnetization of the magnetic layer when a first current is applied; optically detecting the magnetization of the magnetic layer when a second current is applied; and subtracting the optically detected magnetization at the first current and the optically detected magnetization at the second current.

7. The method of claim 6, wherein the first current and second current are equal in magnitude and opposite in polarity.

8. The method of claim 6, wherein the first current is zero.

9. The method of claim 5, further comprising applying a plurality of currents to the sample; optically detecting the magnetization of the magnetic layer at each of the plurality of currents; and analyzing the optically detected magnetization of the magnetic layer at each of the plurality of currents to determine the characteristic of the sample.

10. The method of claim 1, wherein the magnetic layer comprises ferrimagnetic garnet.

11. The method of claim 1, wherein optically detecting the magnetization comprises at least one of imaging and photodetecting the magnetization of the magnetic layer.

12. The method of claim 1, wherein optically detecting the magnetization of the magnetic layer comprises producing an image of the magnetization of the magnetic layer, and wherein analyzing the optically detected magnetization comprises selecting one of a line and an area of the image for analysis; determining the intensity along the line or in the area of the image; and using the determined intensity to determine the characteristic of the magnetic sample.

13. The method of claim 12, wherein using the determined intensity comprises comparing the determined intensity to at least one of a threshold and a reference intensity.

14. The method of claim 13, wherein the at least one of a threshold and a reference intensity is produced empirically or by modeling.

15. The method of claim 12, wherein using the determined intensity comprises using a peak value to determine at least one of the strength of the magnetic field and overwrite.

16. The method of claim 12, wherein using the determined intensity comprises using a half-width value of a line profile to determine a geometric dimension of the magnetic field producing structure.

17. The method of claim 12, wherein using the determined intensity comprises using a slope of a line profile to determine a write gap.

18. The method of claim 12, wherein using the determined intensity comprises using the intensity of an area to determine remanence.

19. The method of claim 12, wherein using the determined intensity comprises using the intensity to determine the strength of the magnetic field produced by the magnetic field producing structure with respect to a current applied to the sample to cause the magnetic field producing structure to produce the magnetic field.

20. The method of claim 1, further comprising controlling the temperature of the magnetic sample while optically detecting the magnetization of the magnetic layer.

21. The method of claim 1, wherein the sample includes a write head with a microactuator, the method further comprising controlling the microactuator while optically detecting the magnetization of the magnetic layer.

22. The method of claim 1, wherein the sample is a write head with a Dynamic-Flying-Height device, the method further comprising controlling the Dynamic-Flying Height device while optically detecting the magnetization of the magnetic layer.

23. The method of claim 1, wherein the sample is a first sample, the method further comprising removing the first sample from the magneto-optical transducer and placing a second sample on the magneto-optical transducer on a different location than the first sample.

24. The method of claim 1, wherein placing a magnetic field producing sample on a magneto-optical transducer comprises holding the sample flat relative to the magneto-optical transducer.

25. The method of claim 1, wherein placing a magnetic field producing sample on a magneto-optical transducer comprises placing a plurality of samples on the magneto-optical transducer.

26. The method of claim 25, wherein optically detecting the change in the magnetization in the magnetic layer comprises simultaneously optically detecting changes in the magnetization of the magnetic layer caused by magnetic fields from at least a subset of the plurality of samples.

27. The method of claim 1, further comprising cleaning the magneto-optical transducer using at least one of air, gas, liquid wash and a wiper.

28. The method of claim 1, wherein placing the magnetic sample on the magneto-optical transducer is performed prior to placing the magneto-optical transducer within a field of view of the polarization microscope.

29. The method of claim 1, further comprising applying an external magnetic field to at least one of the sample and the magneto-optical transducer while optically detecting with the optical device the magnetization of the magnetic layer.

30. The method of claim 1, further comprising:
- placing a reference magnetic field source on the magneto-optical transducer;
- optically detecting with the polarization microscope the change in the magnetization in the magnetic layer caused by a magnetic field from the reference magnetic field source;
- wherein analyzing the optically detected magnetization of the magnetic layer to determine a characteristic of the magnetic sample includes using the optically detected change in magnetization caused by a magnetic field from the reference magnetic field source.

31. The method of claim 1, the magnetic layer having a thickness and a saturation field, the thickness and the saturation field of the magnetic layer are configured so that a magnetic field produced by the sample changes the magnetization in the magnetic layer but does not fully saturate through the thickness of the magnetic layer at any location of the magnetic layer.

32. A method comprising:
  placing a magnetic field producing sample on a magneto-optical transducer having a magnetic layer and a magnetic recording storage layer over the magnetic layer, the magnetic recording storage layer between the sample and the magnetic layer;
  writing a magnetic bit to the magnetic recording storage layer with the magnetic field from the sample;
  optically detecting with a polarization microscope the change in magnetization in the magnetic layer that is caused by at least one of the magnetic field from the sample and the magnetic field from the magnetic bit written on the magnetic recording storage layer;
  analyzing the optically detected change in the magnetization in the magnetic layer to determine a characteristic of the sample; and
  storing in memory the determined characteristic of the sample.

33. The method of claim 32, wherein the sample is a write head.

34. The method of claim 33, wherein the write head is in the form of one of a bar, slider, head gimbal assembly or head stack assembly.

35. The method of claim 32, further writing a magnetic bit comprises applying a current to the sample causing the sample to produce the magnetic field.

36. The method of claim 35, wherein optically detecting the magnetization of the magnetic layer with an polarization microscope comprises optically detecting the magnetization of the magnetic layer when a first current is applied; optically detecting the magnetization of the magnetic layer when a second current is applied; and subtracting the optically detected magnetization at the first current and the optically detected magnetization at the second current.

37. The method of claim 36, wherein the first current and second current are equal in magnitude and opposite in polarity.

38. The method of claim 36, wherein the first current is zero.

39. The method of claim 35, further comprising applying a plurality of currents to the sample; optically detecting the magnetization of the magnetic layer at each of the plurality of currents; and analyzing the optically detected magnetization of the magnetic layer at each of the plurality of currents to determine the characteristic of the sample.

40. The method of claim 32, wherein the magnetic layer comprises ferrimagnetic garnet.

41. The method of claim 32, wherein optically detecting the magnetization comprises at least one of imaging and photodetecting the magnetization of the magnetic layer.

42. The method of claim 32, wherein optically detecting the magnetization of the magnetic layer comprises producing an image of the magnetization of the magnetic layer, and wherein analyzing the optically detected magnetization comprises selecting one of a line and an area of the image for analysis; determining the intensity along the line or in the area of the image; and using the determined intensity to determine the characteristic of the magnetic sample.

43. The method of claim 42, wherein using the determined intensity comprises comparing the determined intensity to at least one of a threshold and a reference intensity.

44. The method of claim 43, wherein the at least one of a threshold and a reference intensity is produced empirically or by modeling.

45. The method of claim 43, wherein using the determined intensity comprises using a peak value to determine at least one of the strength of the magnetic field and overwrite.

46. The method of claim 43, wherein using the determined intensity comprises using a half-width value of a line profile to determine a geometric dimension of the sample.

47. The method of claim 43, wherein using the determined intensity comprises using a slope of a line profile to determine a write gap.

48. The method of claim 43, wherein using the determined intensity comprises using the intensity of an area to determine remanence.

49. The method of claim 43, wherein using the determined intensity comprises using the intensity to determine the strength of the magnetic field produced by the sample with respect to a current applied to the sample.

50. The method of claim 32, further comprising controlling the temperature of the magnetic sample while optically detecting the magnetization of the magnetic layer.

51. The method of claim 32, wherein the sample includes a write head with a microactuator, the method further comprising controlling the microactuator while optically detecting the magnetization of the magnetic layer.

52. The method of claim 32, wherein the sample is a write head with a Dynamic-Flying-Height device, the method further comprising controlling the Dynamic-Flying Height device while optically detecting the magnetization of the magnetic layer.

53. The method of claim 32, wherein the sample is a first sample, the method further comprising removing the first sample from the magneto-optical transducer and placing a second sample on the magneto-optical transducer on a different location than the first sample.

54. The method of claim 32, wherein placing a magnetic field producing sample on a magneto-optical transducer comprises holding the sample flat relative to the magneto-optical transducer.

55. The method of claim 32, wherein placing a magnetic field producing sample on a magneto-optical transducer comprises placing a plurality of samples on the magneto-optical transducer.

56. The method of claim 32, wherein optically detecting the change in the magnetization in the magnetic layer comprises simultaneously optically detecting changes in the magnetization of the magnetic layer caused by magnetic fields from at least a subset of the plurality of samples.

57. The method of claim 32, further comprising cleaning the magneto-optical transducer using at least one of air, gas, liquid wash and a wiper.

58. The method of claim 32, wherein placing the magnetic sample on the magneto-optical transducer is performed prior to placing the magneto-optical transducer within a field of view of the polarization microscope.

59. The method of claim 32, further comprising removing the sample from the magneto-optical transducer after writing the magnetic bit to the magnetic recording storage layer but before optically detecting the change in magnetization in the magnetic layer.

60. The method of claim 32, further comprising applying an external magnetic field to at least one of the sample and the magneto-optical transducer while optically detecting with the optical device the magnetization of the magnetic layer.

* * * * *